United States Patent
Blattner et al.

(10) Patent No.: US 8,425,172 B2
(45) Date of Patent: *Apr. 23, 2013

(54) RETICLE MANIPULATION DEVICE

(75) Inventors: Jakob Blattner, Ermatingen (CH); Rudy Federici, Berg (CH); William Fosnight, Carlisle, MA (US); Clint Harris, Lunenburg, MA (US)

(73) Assignee: Brooks Automation, Inc., Chelmsford, MA (US)

( * ) Notice: Subject to any disclaimer, the term of this patent is extended or adjusted under 35 U.S.C. 154(b) by 18 days.

This patent is subject to a terminal disclaimer.

(21) Appl. No.: 12/761,499

(22) Filed: Apr. 16, 2010

(65) Prior Publication Data

US 2010/0292826 A1 Nov. 18, 2010

Related U.S. Application Data

(63) Continuation of application No. 10/628,980, filed on Jul. 29, 2003, now Pat. No. 7,699,573.

(51) Int. Cl.
*H01L 21/677* (2006.01)
(52) U.S. Cl.
USPC .......................................... 414/217; 414/939
(58) Field of Classification Search .................. 414/217, 414/939
See application file for complete search history.

(56) References Cited

U.S. PATENT DOCUMENTS

| 4,139,877 | A | * | 2/1979 | Townsend | 360/267.8 |
| 4,999,671 | A |   | 3/1991 | Iizuka    |           |
| 5,758,099 | A | * | 5/1998 | Grieco et al. | 710/301 |
| 6,059,507 | A |   | 5/2000 | Adams    |           |
| 6,142,722 | A |   | 11/2000 | Genov et al. |       |
| 6,515,346 | B1 | * | 2/2003 | Kemeny  | 257/618   |
| 6,615,091 | B1 | * | 9/2003 | Birchenough et al. | 700/96 |
| 6,690,993 | B2 | * | 2/2004 | Foulke et al. | 700/218 |
| 6,900,135 | B2 | * | 5/2005 | Somekh et al. | 438/704 |
| 2002/0094257 | A1 | * | 7/2002 | Babbs et al. | 414/277 |

FOREIGN PATENT DOCUMENTS

| EP | 1 052 547   | 11/2000 |
| WO | WO 02/01292 | 1/2002  |
| WO | WO 02/08831 | 1/2002  |

* cited by examiner

*Primary Examiner* — Scott Lowe
(74) *Attorney, Agent, or Firm* — Perman & Green, LLP; Colin C. Durham

(57) ABSTRACT

A reticle manipulating device comprising a housing capable of having a controlled environment wherein at least one processing module is connected to the housing and capable of processing a reticle. A transport apparatus is connected to the housing for transporting the reticle between the at least one module to another portion of the housing. At least one module is removably connectable to the housing and at least one module has an interface adapted for removably coupling the module to the housing. One module being selectable for connection to the housing from a number of different interchangeable module each having a different predetermined characteristic and being capable of connection to the housing.

16 Claims, 22 Drawing Sheets

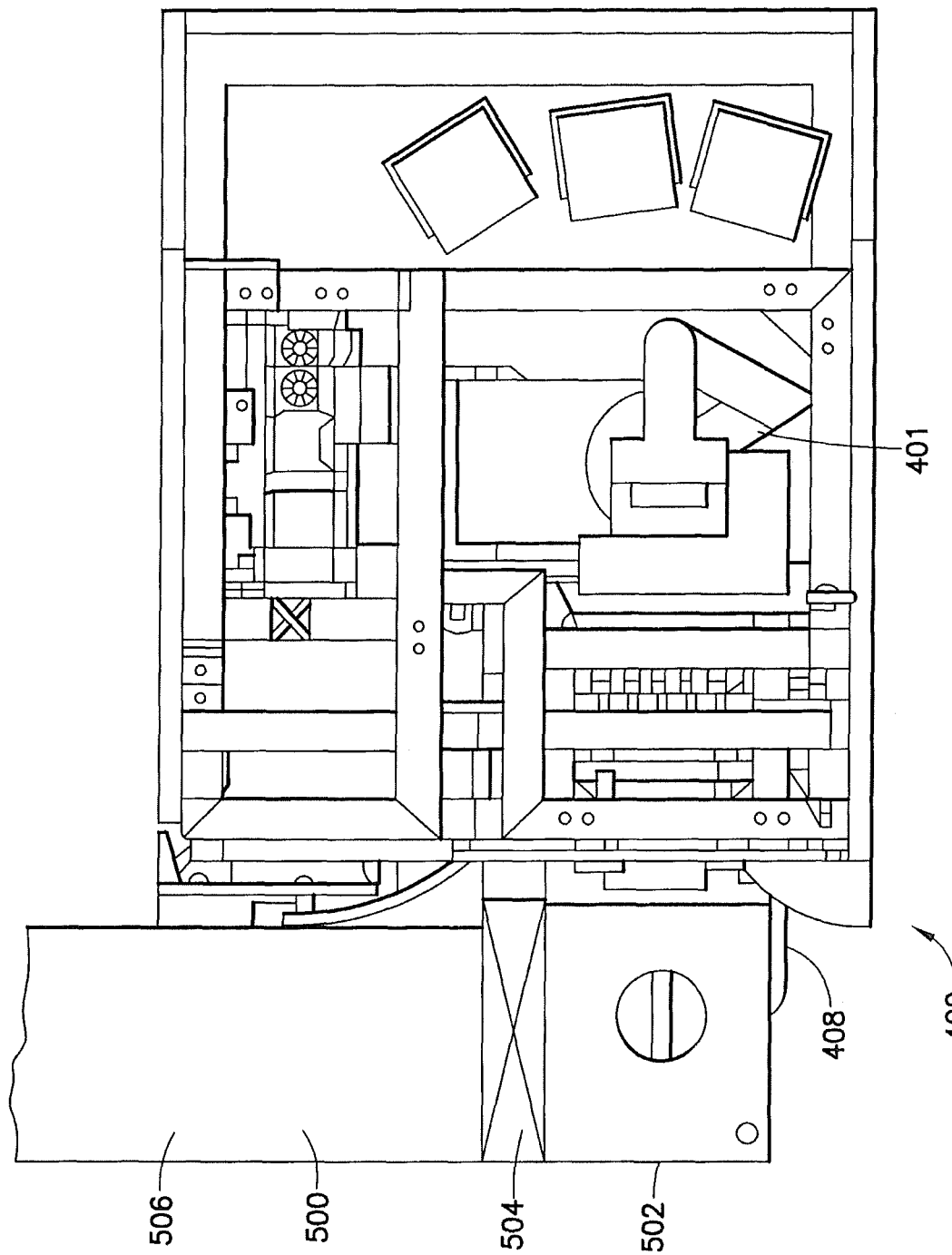

RETICLE MANIPULATION DEVICE

CROSS-REFERENCE TO RELATED APPLICATION(S)

This application is a continuation from application Ser. No. 10/628,980, filed Jul. 29, 2003, the disclosure of which is incorporated by reference herein in its entirety.

BACKGROUND OF THE DISCLOSURE

1. Field of the Disclosure

The present disclosure and embodiments relate to a reticle manipulating device with an at least substantially closed housing for maintaining clean-room conditions inside the housing, an input/output station for introducing and discharging reticles in and out of the housing, and at least one functional unit arranged in the housing for impressing a predetermined function on the reticles, wherein, by means of a manipulating device also arranged inside the housing, the reticles can be manipulated in the housing.

2. Brief Description of Earlier Related Developments

So-called reticles are required in the production of electronic components. These involve exposure masks or photomasks, with which structures lying in the micrometer and nanometer range are imprinted on semiconductors or other substrates in the projection exposure process. It is frequently provided to produce specific electronic components in batches, for which reason, the reticles are used only for specific times during the production. In between times, the exposure masks must be intermediately stored. Stocker devices have been previously known for this purpose, in which a plurality of reticles can be intermediately stocked. Such stocker devices of the prior art, which are usually called stockers, have an essentially closed housing for this purpose. The housing is provided with openings only for the input and output of air and for introducing and discharging the reticles. Clean-room conditions prevail inside the housing, by which means a contamination of the reticles will be avoided.

It is known sufficiently that in the manufacture of electronic components any ever so small dirt particle and any ever so slight damage to the reticle leads to costly rejects. It is thus desired to avoid dirt or damage. For this reason, it has become known to examine reticles for contamination directly prior to introducing them into the production process. If dirt is found, then it can be removed from the reticle by a cleaning unit. A unit in which both a cleaning device and a detection device are arranged in a stocking device for reticles is known from WO 02/01292 A1 of the same Applicant.

The reticles are usually transported in a specific, standardized transport box during production from their storage place to a processing plant and back again. A plurality of such transport boxes exist, whereby reticle manipulating devices of the prior art are usually equipped only for one or at most a few types of transport boxes.

It appears to be a disadvantage in these units of the prior art that they do not offer possibilities for responding to different application conditions. No measures are provided for adapting the device to changing application conditions.

SUMMARY OF THE INVENTION

A reticle manipulating device comprising a housing capable of having a controlled environment therein, at least one processing module connected to the housing and capable of processing a reticle, and a transport apparatus connected to the housing for transporting the reticle between the at least one module to another portion of the housing.

The at least one module being removably connectable to the housing, the at least one module having an interface adapted for removably coupling the module to the housing, and the at least one module being selectable for connection to the housing from a number of different interchangeable module each having a different predetermined characteristic and being capable of connection to the housing.

BRIEF DESCRIPTION OF THE DRAWINGS

The foregoing aspects and other features of the present invention are explained in the following description, taken in connection with the accompanying drawings, wherein:

FIG. 27 is a schematic plan view of still yet another embodiment of the reticle manipulating system.

DETAILED DESCRIPTION OF THE PREFERRED EMBODIMENT

Figure 1:
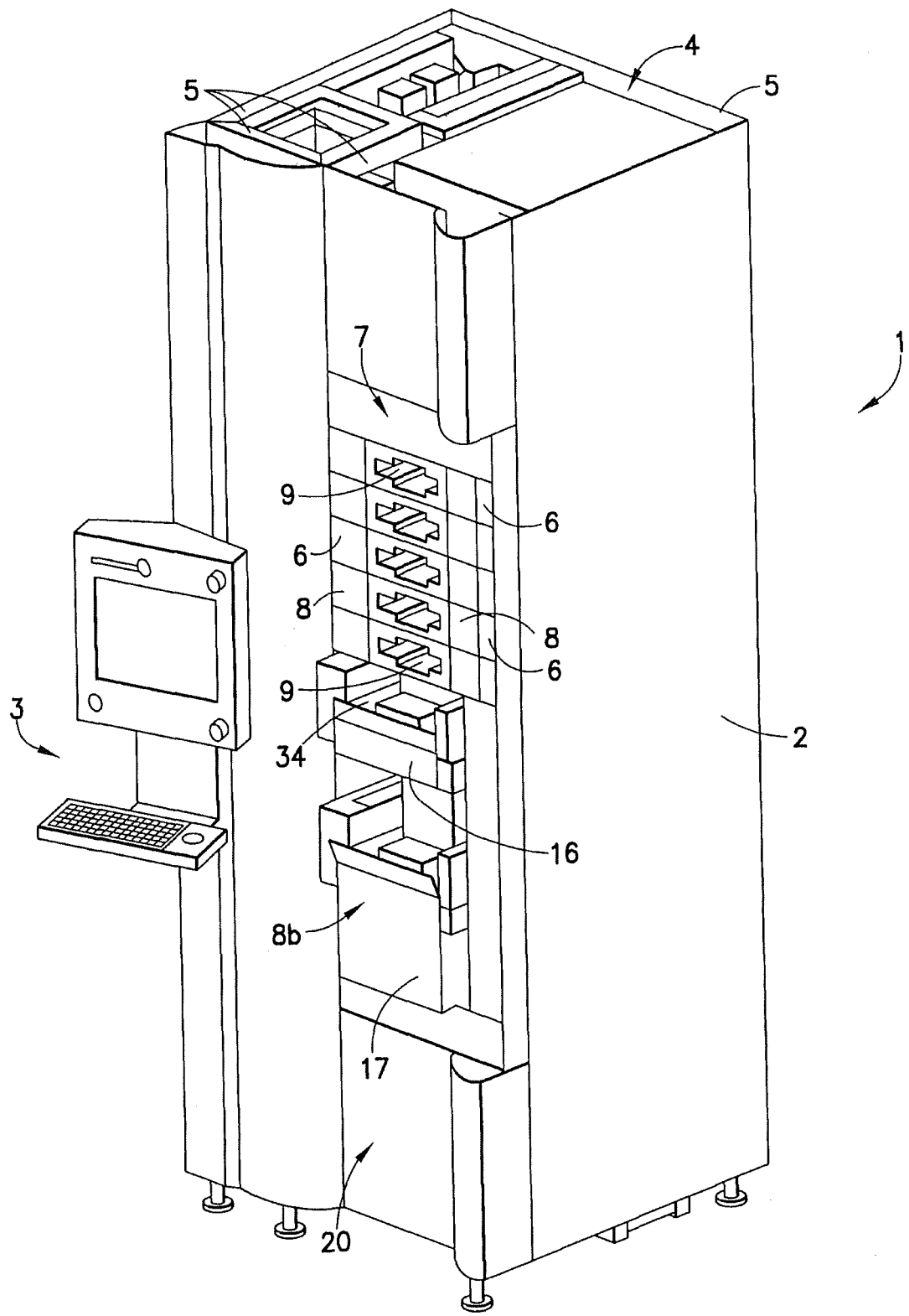
FIG. 1 shows a perspective representation of a reticle manipulating device according to the invention.
Figure 2:
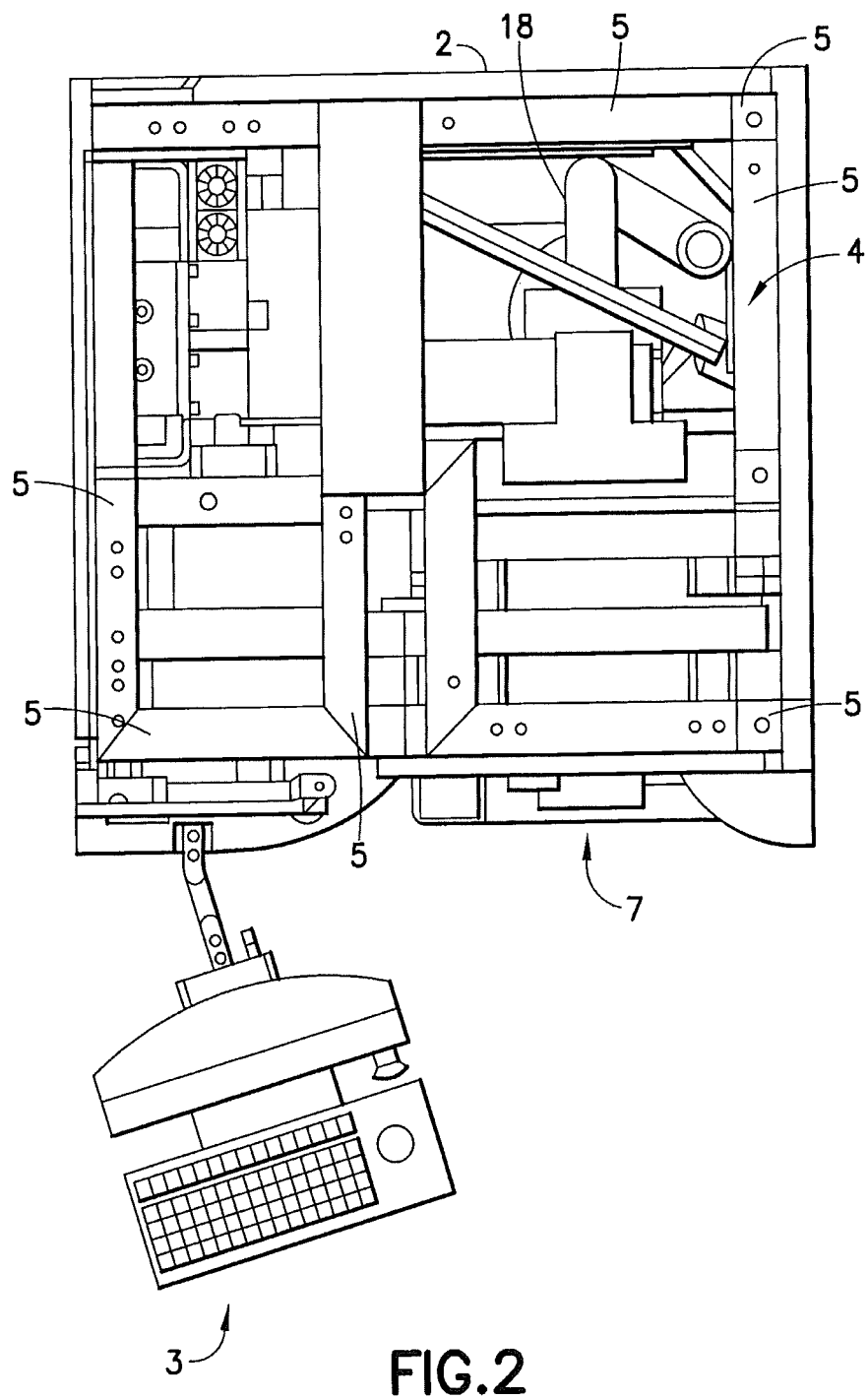
FIG. 2 shows the reticle manipulating device of FIG. 1 in a top view.

A reticle manipulating device 1 according to the invention, which is provided as a so-called "stand-alone" device for integration in a production plant for electronic components, such as, for example, memory modules and processors, is shown in FIG. 1 and FIG. 2. The manipulating device is provided with an essentially closed housing 2, which serves for maintaining clean-room conditions inside the space enclosed by the housing 2. A cover part of the housing is not shown in FIG. 1 and FIG. 2 for reasons of clarity in the drawing. In order to produce clean-room conditions, the manipulating device can be provided with means for producing clean-room conditions, which is previously known in and of itself and subsequently will not be explained in more detail. On one outer side of the housing, an input station 3 is arranged, which is joined with a control of the manipulating device 1, which is not shown in more detail.

The housing 2 is fastened to a rack 4 of the manipulating device, which is formed essentially from profiled tubes 5. The profiled tubes 5 have various possibilities for fastening either additional profiled tubes or, however, components of the manipulating device, particularly functional units. For this purpose, profiled tubes 5 are provided with recesses, preferably at predefined places, in which screws or other fastening means can be arranged. Of course, instead of recesses, other receiving means or fastening means arranged at predetermined places can also be provided.

This design contributes in a constructively simple manner to a modular design which permits an assembly of different reticle manipulating devices, by selection of a partial set of functional units each time from a pregiven set of functional units and integrating them into a rack. In this way, rack 4 should also be designed as a modular system, which essentially is comprised of a limited number of different profiles 5 and joining elements. In the following, for example, several of the many possible configurations of manipulating devices, each of which belongs to the same system, will be explained.

The aspect of modular design also includes the fact that individual functional units can be removed or installed wholly or partially from or into an already existing reticle manipulating device 1. For installing and removing, the functional units are to be connected or detached with the respective reticle maniplating device only from their mechanical and electrical interface with the respective reticle manipulating device. This can be done, for example, for repair, maintenance or for later replacement by other functional units.

Several panels 6 of an input/output station 7 are integrated into the front side of housing 2. Each of panels 6 belongs to an input/output unit 8 which is also modular. One edge of an opening 9 of the respective panel 6 is provided with a contour which corresponds at least approximately to the outer contour of each type of transport box provided for the transport of reticles. Openings 9 are configured such that the transport box provided for the respective input/output unit 8 can be introduced through the corresponding opening 9. One possible closed transport box 10 is shown, for example, in FIG. 3, and a reticle 12 lying on a bottom part 11 of an opened transport box 10 is shown in FIG. 4. As FIG. 5 shows, the panels are also provided with self-closing flaps 15. Thus, the danger of a penetration of particles through the corresponding opening 9 into the manipulating device exists only for a short time during introduction or removal of a reticle.

Two drawers 16, 17 of different structural height and which can be pulled out, are present as components of additional input/output units 8 of the input/output station 7 of FIG. 1. Larger transport boxes, for example, those which can accommodate more than one reticle, can also be introduced into the manipulating device 1 by means of each of these drawers 16, 17. For reasons of clarity in the drawing, the panels of these two input/output units 8 are not shown in FIG. 1.

Figure 10:
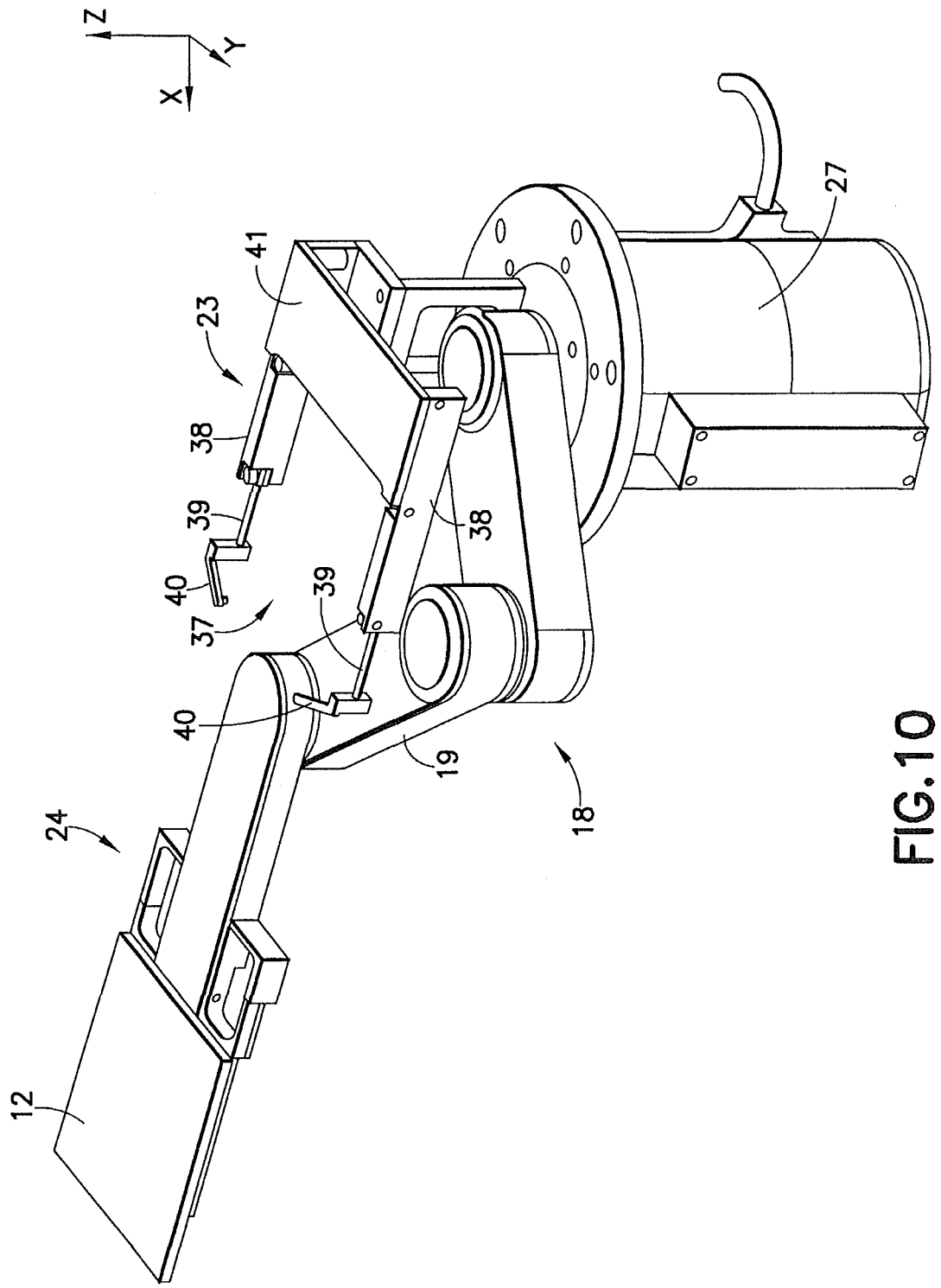
FIG. 10 shows a perspective representation of a reticle manipulating device of the device in FIG. 1.

The manipulating device of FIG. 1 and FIG. 2 also has a manipulating device 18 in the form of a bent-arm robot, which is arranged inside the housing 2 (see also FIG. 10). The bent arm 19 which moves in a horizontal plane is arranged so that it moves in a vertical Z axis, which is not shown in detail. The movement range of the robot is thus fine-tuned to the arrangement of the individual components, particularly the functional units, of the manipulating device 1, so that the robot can receive the reticles 12 from any functional unit and transfer them to another functional unit. The bent-arm robot is provided with a gripper, which will be explained in more detail later, by means of which reticles 12 are received and can be held during their transport inside the manipulating device.

In the example of embodiment shown in FIG. 1, a detection/cleaning device 20 arranged underneath the input/output station is provided as another functional unit. The latter is concealed by housing 2 in FIG. 1, but is visible in FIG. 6. Another possible embodiment of a detection and cleaning device is shown in WO 02/01292 A1 of the same Applicant.

As can be recognized particularly in the top view onto the manipulating device according to FIG. 2, each functional unit is separated spatially from the other functional units. This also facilitates the exchangeability and the engagement in individual functional units.

Figure 5:
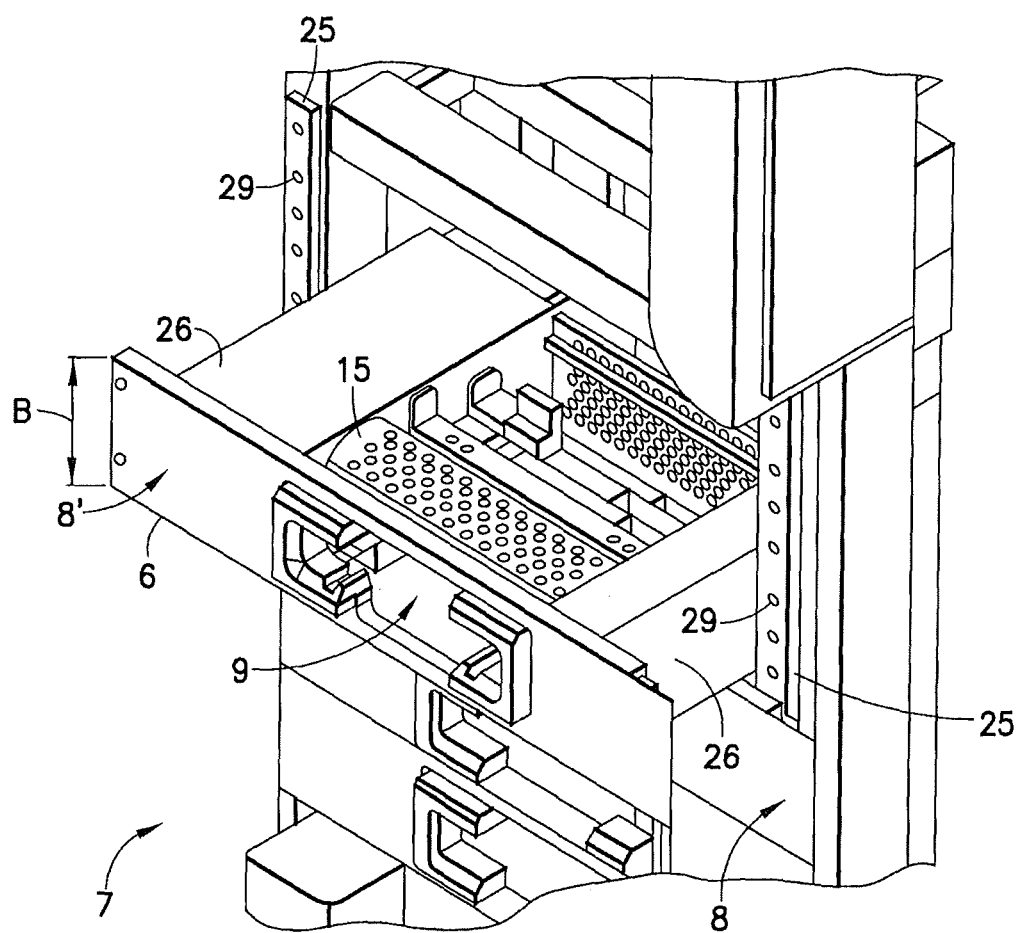
FIG. 5 shows a perspective partial representation of an input/output station of the device.
Figure 6:
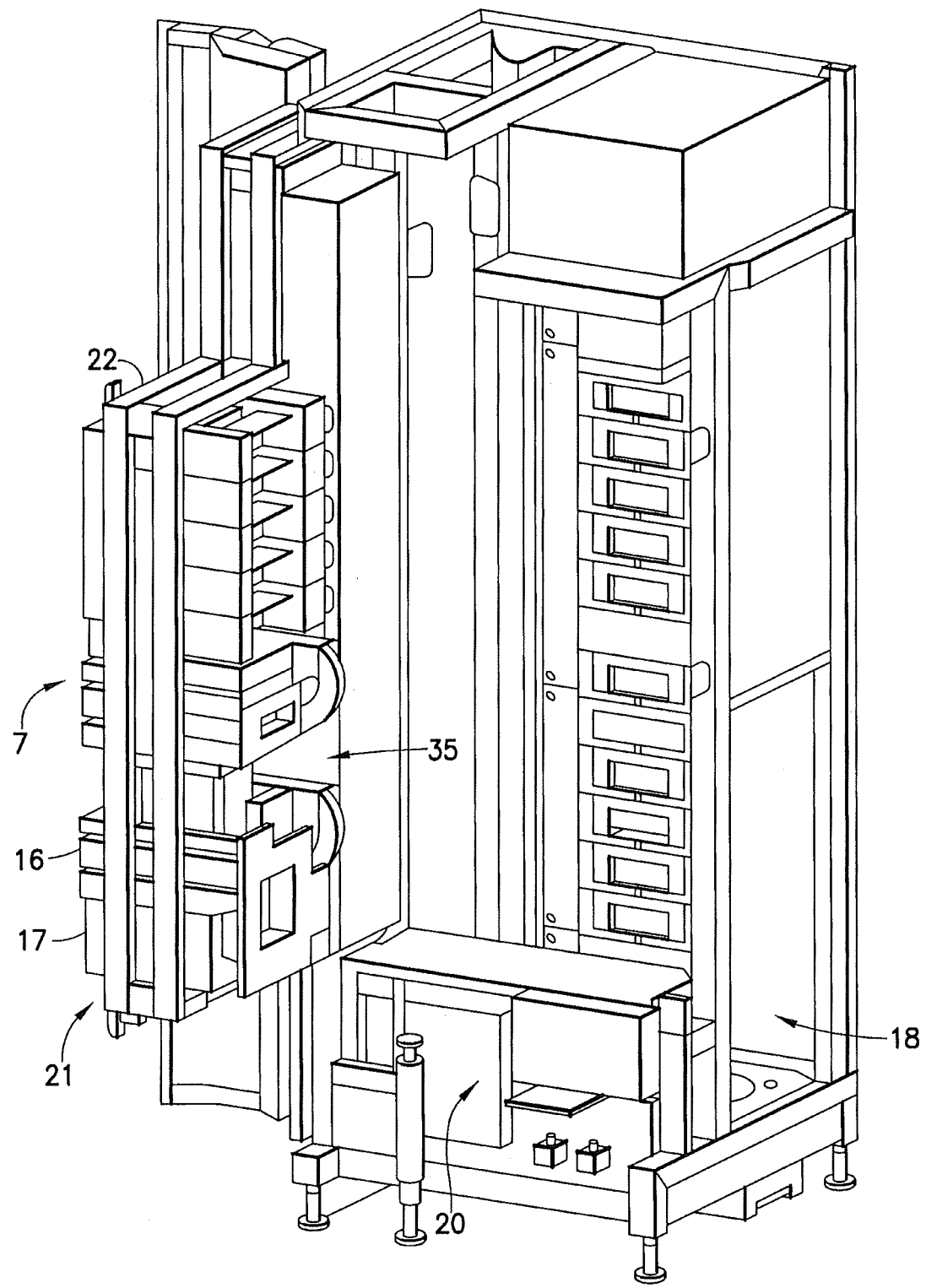
FIG. 6 shows a perspective representation of the manipulating device of FIG. 1 in an opened state.

Details of the construction of the input/output station 7 shown in the example of embodiment can be taken from the partial representation of FIG. 5 in conjunction with FIG. 6. Accordingly, the input/output station 7 has a door 21 that can be swung out, which forms a mounting frame 22. Recesses 29, on which panels 6 of input/output units 8 can be attached in a detachable manner, are set on a mounting frame 22 at a distance from one another on vertical strips 25 with a specific basic grid size.

Figure 6A:
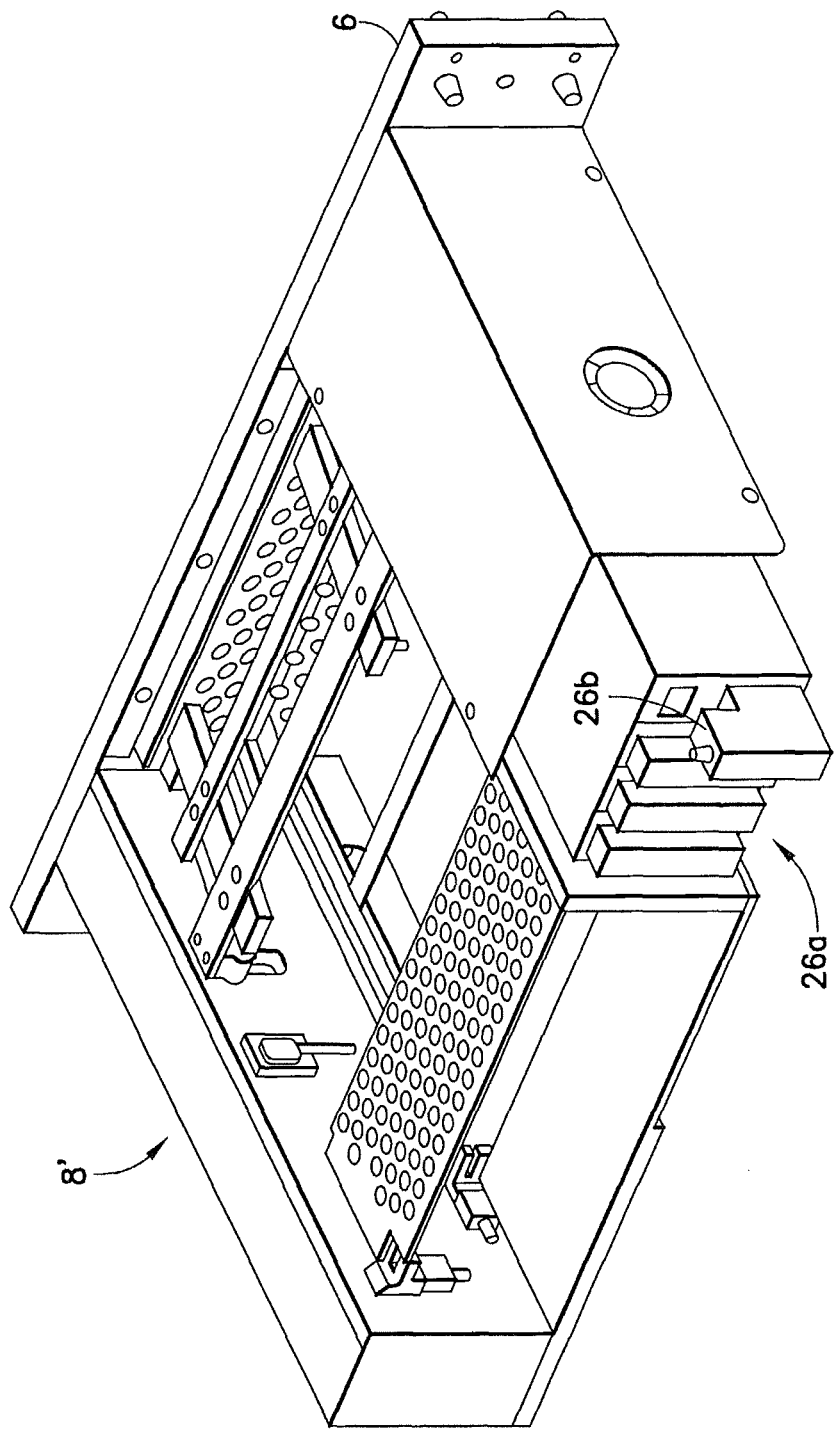
FIG. 6a shows a perspective representation of an input/output unit from behind.

The input/output unit 8', shown only partially inserted into the frame in FIG. 5, has a panel 6, whose opening 9 has a contour that is fine-tuned to a specific type of transport box. The input/output unit is further provided with two side pieces 26 essentially rectangular in cross section, in which drive units of the input/output unit are arranged, [including] among others, an opening/closing mechanism for the transport boxes. Each of the input/output units is inserted into a compartment of the mounting frame 22, which is shaped according to its size, by means of side pieces 26, and is attached in a detachable manner to this frame. The input/output stations can be connected via the same plug connectors each time to the manipulating device, relative to electrical connections (electrical interface) for control and current supply. For this purpose, each input/output unit can be provided with a standardized, so-called VIPA module 26a, as can be recognized in FIG. 6a. The VIPA modules 26a of the input/output units always have the same plug connector 26b, with which the respective input/output unit can be connected in a simple way via only one (not shown) cable to the central control of the manipulating device 1. In addition, drawers 16, 17 are inserted into compartments of the mounting frame 22 (FIG. 6). Drawers 16, 17 additionally have input/output mechanisms not shown in further detail, such as those previously known in principle, for example, drawers of furniture.

The width and depth of side pieces 26 each time, as well as their distance relative to one another, are kept the same in all input/output units with front openings 9 in the panel 6. Only their height can be varied to adapt the panel height to different transport boxes. The variation in height, however, can be made only in whole-number multiples of a basic grid size.

The width of panels 6 is the same for all panels. With respect to their height, panels 6 can vary in whole-number multiples of a basic grid size B of the panels. Due to this building-block modular construction also of the input/output station 7, it is possible with only small expenditure to configure the input/output station 7 of a manipulating device according to the invention in different ways and to adapt it to the requirements indicated in each case. Input/output units 8, 8' can also subsequently be retrofitted, for example, for a new type of transport box, in a very simple way thereby, in the unused insertion compartments of the respective input/output station.

As in the first configuration example which is shown in FIG. 1, space is provided also in a second configuration example, which is not shown, for a maximum of twelve input/output units 8, each of which has the minimum structural height-corresponding to the basic grid size B. Unlike FIG. 1, here twelve input/output units 8 are actually provided. These twelve input/output units 8 can be adapted to only one type of transport box. Alternatively, it may also be provided that input/output units are provided for at least two different types of transport box.

In a third configuration example of the input/output station 7 of the same reticle manipulating device 1, which is also not shown, the three upper input/output units 8 can be identical in construction and thus in turn can be provided for the same type of transport box. The same applies to the next two input/output units 8 down, which are provided also only for one type of transport box—however, a different one than the one which can be received by input/output units in the manipulating device. Also, input/output units 8a provided for so-called SMIF mono-pod transport boxes are thus also configured in an identical manner to one another. Each of these input/output units has a structural height, which corresponds to double the basic grid size B.

The next input/output unit 8b is provided for so-called SMIF multi-pods and has a structural height, which corresponds to five times the basic grid size B. An empty compartment, which is covered by a completely closed panel 6' is found between the two input/output units 8a and 8b. The height of the panel 6' corresponds to the basic grid size. In all of the configuration examples, the overall structural height of the input/output stations is the same and corresponds to twelve basic grid sizes B. It can be seen from these configuration examples that the input/output units can be randomly combined with one another.

Regardless of the particular configuration, a photosensor is arranged in each input/output station, which detects whether a transport box occupies a final position within the respective input/output unit 8, 8a, 8b. If this is the case, then a control of the manipulating device 1 sets in motion a mechanism for the automatic opening of the transport box, based on a corresponding signal of the sensor. At the same time or beforehand, the front opening of the input/output station can also be closed by means of the respective front flap 15 (FIG. 5), which can be coupled to a lever, which is not shown in detail.

Devices for opening reticle transport boxes are previously known in and of themselves, for example, by the products Guardian Reticle Stocker, Colorado and Zaris of the company Brooks-Pri Automation Inc., Chelmsford (Mass.), USA or its predecessors in title. Such opening mechanisms can be used in principle for input/output units.

Figure 3:
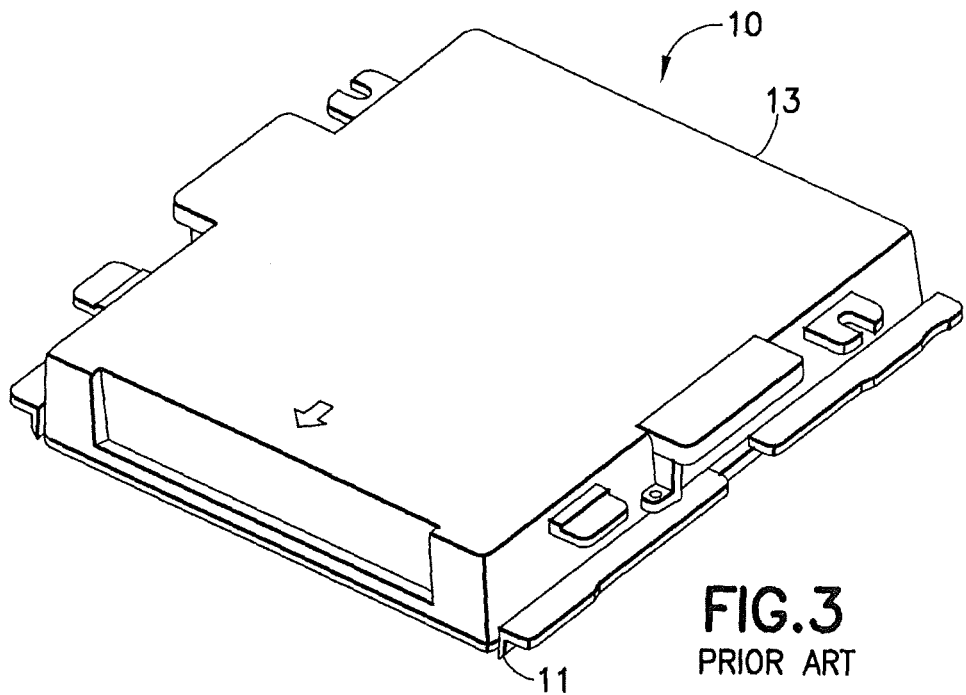
FIG. 3 shows a transport box of the prior art in closed state.
Figure 4:
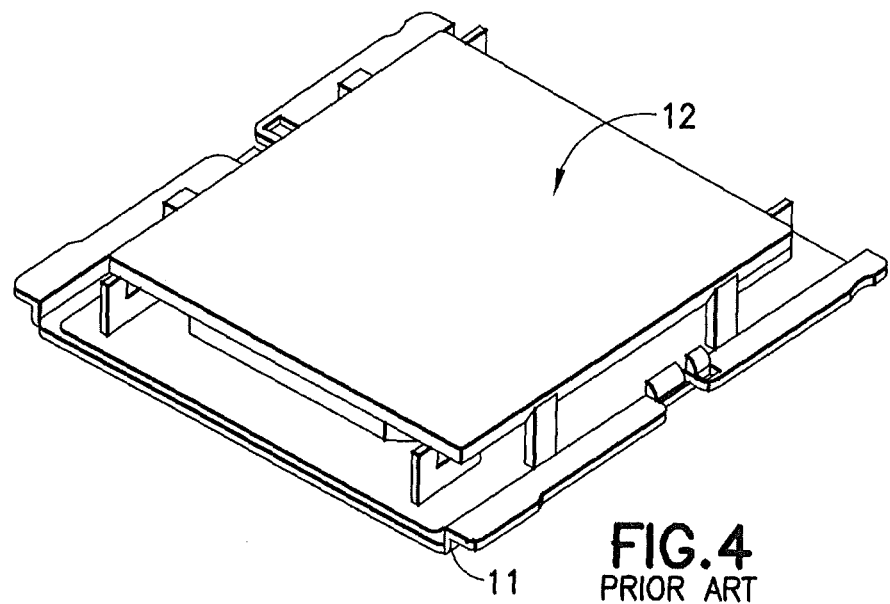
FIG. 4 shows the transport box of FIG. 3 in opened state.

In the type of transport box 10 which is shown in FIG. 3 and FIG. 4, the opening process releases a catch between the bottom part 11 and a cover 13 of the transport box 10, the latter are separated from each other, and the reticle 12 arranged on the bottom part 11 is thus made accessible.

Figure 7:
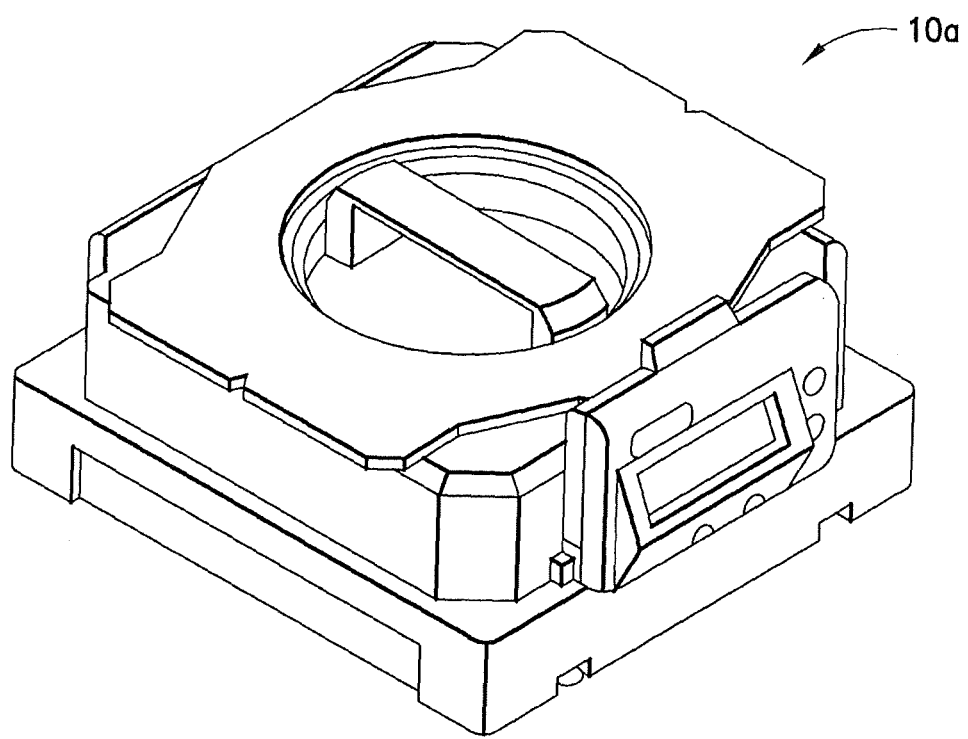
FIG. 7 shows a closed transport box in the form of an SMIF mono-pod.
Figure 8:
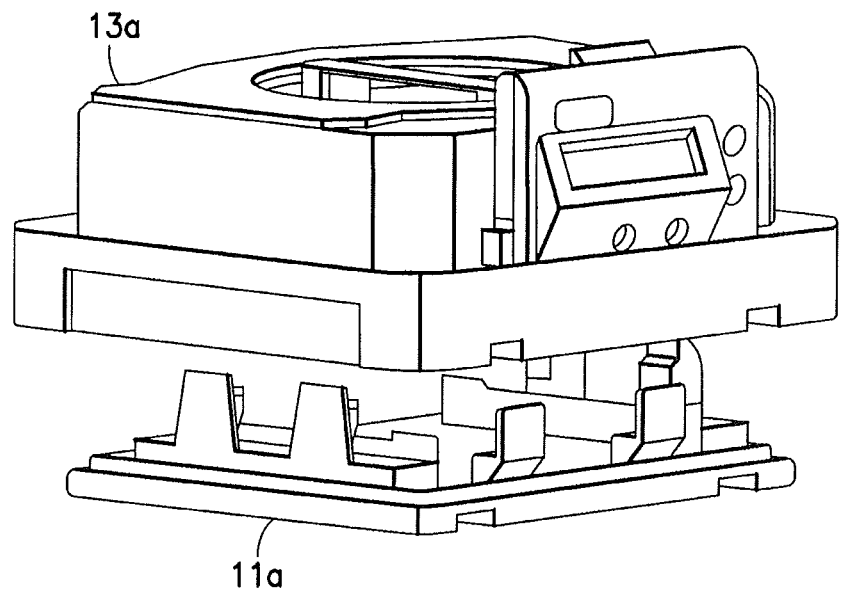
FIG. 8 shows the transport box of FIG. 7 in opened state.

The input/output unit which is provided with the drawer 16 and which is shown, among other elements, in FIG. 1 and FIG. 6, is provided inside the manipulating device for opening and closing the so-called SMIF mono-pod transport boxes 10a. The bottom part 11a and the cover 13a of such a standardized SMIF-mono-pod transport box 10a are shown in FIG. 7 and FIG. 8. The drawer that can be moved longitudinally in the horizontal direction has a mechanism, which is previously known in and of itself, for opening this SMIF transport box, as is implemented, for example, in the products SMIF Lean Robot SLR150 or Ergospeed of the above-named company Brooks-Pri Automation, Inc. The opening mechanism of the product SMIF-LPT2150 which is offered by the company Asyst Technologies Inc., USA, is also suitable in principle. The drawer 16 is provided with a plate 34 (FIG. 1) arranged inside a frame, and the SMIF box 10a is arranged on this plate. After the drawer 16 is inserted into the input/output station and the bottom part 11a of the SMIF transport box 10a is bolted to plate 34, plate 34 together with bottom part 11a and a reticle found thereon (not shown in FIG. 8) is lowered. The cover 13a, in contrast, remains stationary. Therefore, the respective reticle is accessible to the gripper from the back side 35 of the drawer or the input/output station lying inside the housing 2 (see also FIG. 6).

Figure 9:
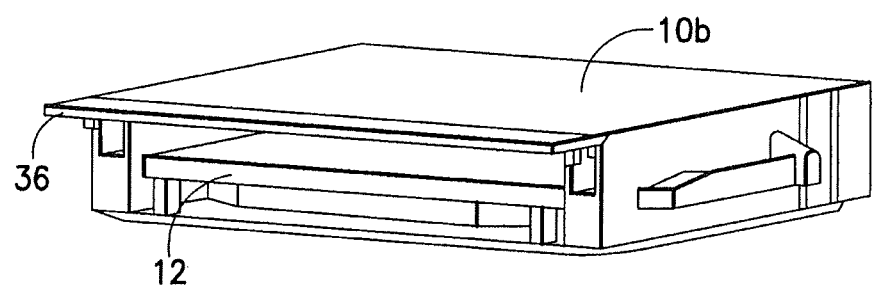
FIG. 9 shows another type of transport box with opened front flap.

In another type of transport box 10b, which is shown in FIG. 9, in order to open the box, only one front flap 36 of the box is swung out, whereupon the reticle 12 arranged in the box 10b also becomes accessible. For opening and closing this transport box, an input/output unit adapted to the type of transport box is provided in the input/output station 7.

Regardless of the actual configuration of the respective opening mechanism, a central control of the manipulating device also coordinates the introduction of the gripper which will be described in more detail below, by which the reticle is grasped and is transferred to a functional unit.

Figure 11:
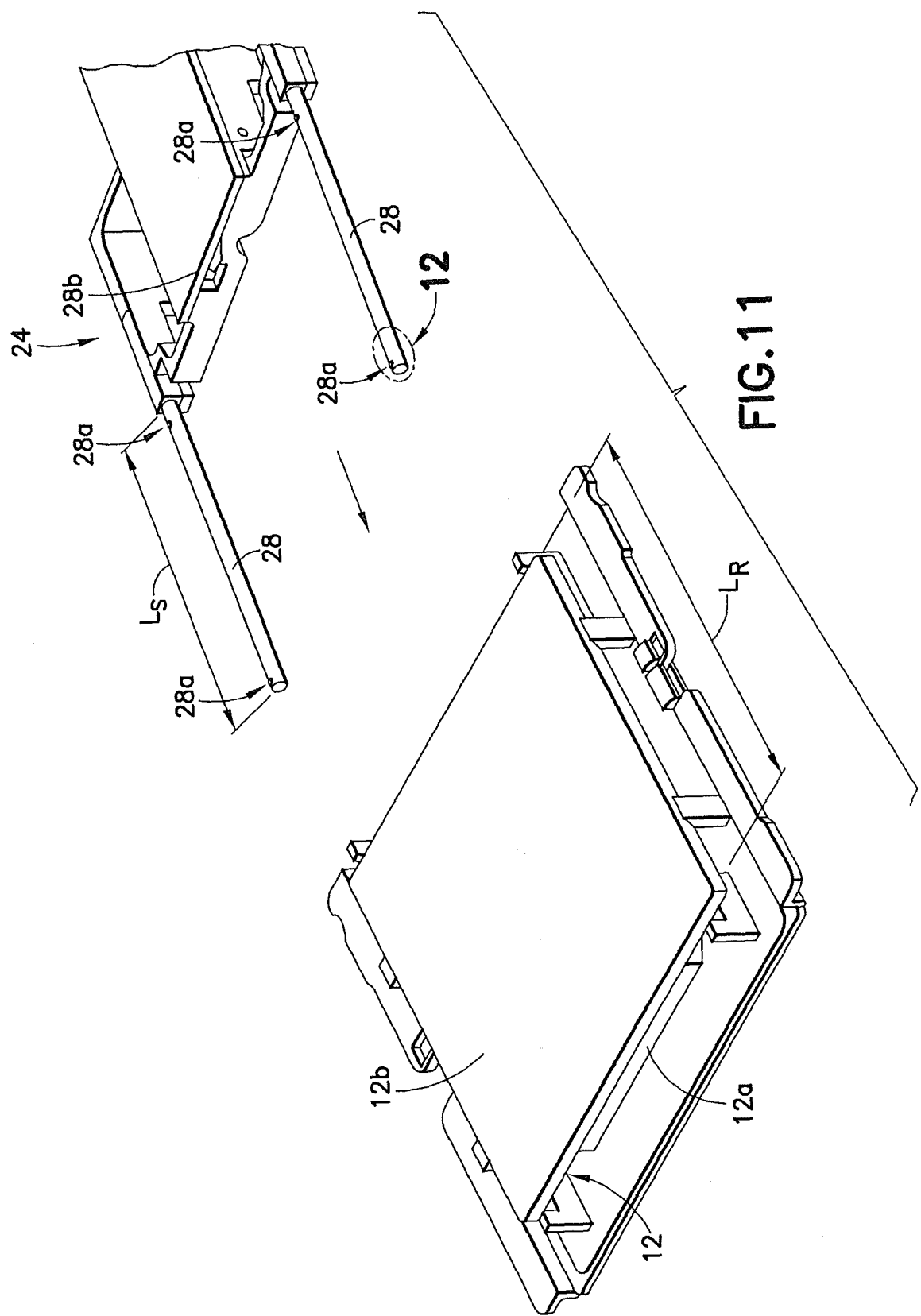
FIG. 11 shows a gripping part of the reticle manipulating device of FIG. 12 directly prior to grasping of a reticle.

The universal reticle gripper, which is shown in more detail in FIG. 10, is arranged on a manipulating device 18 configured as a three-link bent-arm robot. All of the swivelling axes of the bent-arm robot run parallel to one another. A gripping part 24 of the manipulating device 18 is found on a free end of the bent arm 19, while a locking part 23 is fastened onto a platform 27 of the bent arm 19. The detailed representation of FIG. 11 shows that the gripping part has two rods 28 which are identical and aligned parallel to one another and are fixed relative to one another. The rods 28 are attached in gripping part 24 perpendicular to a stopping face 28b of the gripping part. In the example of embodiment shown in FIG. 11, the cross-sectional surfaces of rods 28 are essentially round, whereby the cross-sectional surfaces are each provided with a diameter of approximately 4 mm. Of course, other cross-sectional shapes can also be basically used.

The length $L_S$ of the rods 28 is adapted to the reticles which are standard in size, so that their free length is shorter than the length of one side edge (length $L_R$) of the reticle in a direction parallel to the rods 28 (FIG. 11). The length $L_S$ of the rods should have a value that is smaller than the length $L_R$ of the reticle, but greater than half the length $L_R$. In this way, the gripper is particularly well suitable for removing the reticles from different transport boxes.

Figure 12:
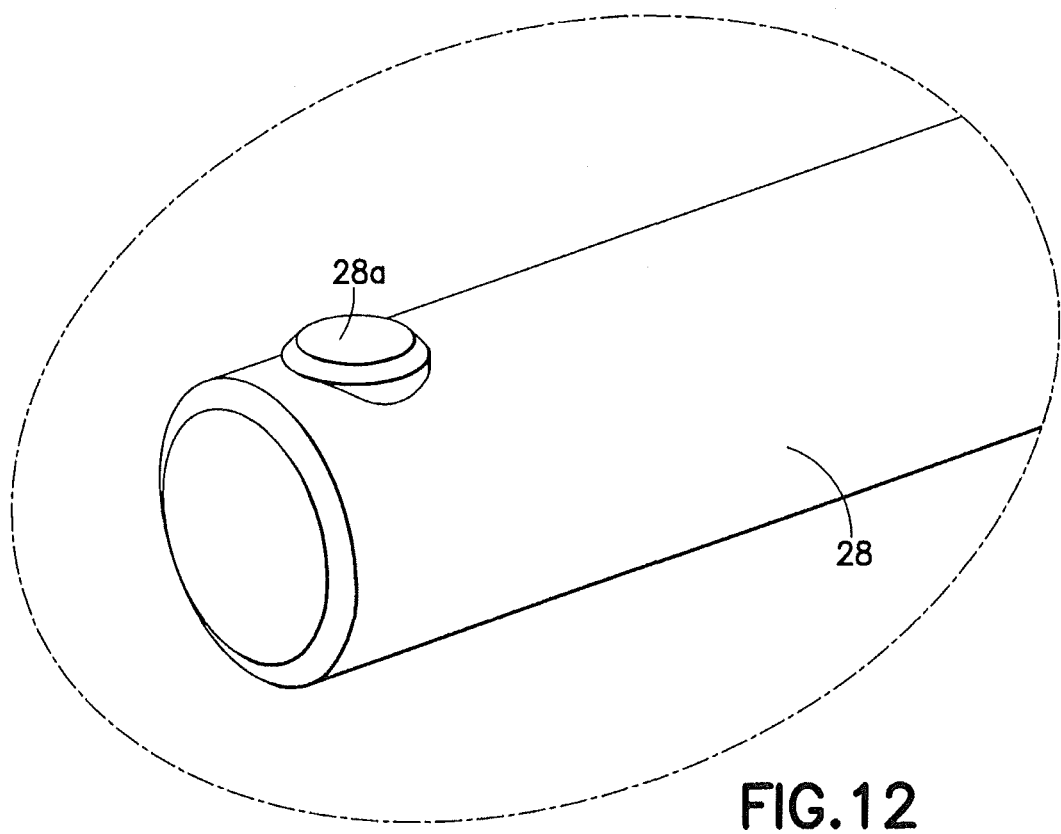
FIG. 12 shows a detail representation of the gripping part along line XII of FIG. 11.

Cams 28a which point upward are also arranged on each rod 28, in the region of both the front and back ends, and these cams are provided as supports for reticles (FIG. 11 and FIG. 12).

When a reticle is grasped, its position on gripping part 24 can be predetermined by contact on the front side with the stopping face 28b. The motor current increases upon contact between the gripping part 24 and a reticle. By monitoring the motor current, such an increase can be detected by a control of the manipulating device 18 and thereupon the corresponding drive motion can be halted. Alternatively or also in addition to this limitation of the travel movement, a proximity sensor, which is not shown, can be provided, by means of which a determination can be made of whether a reticle is present in the region of the stopping face 28b.

The locking part 23 of the manipulating device 18, which is shown in FIG. 10, is arranged at the same height relative to a vertical position of the gripping part 24. It has a bifurcated receiving member 37, whose two side pieces 38, which are aligned parallel to one another, are at a distance which is only insignificantly greater than the width of a reticle. In each of the two side pieces 38, a rod 39 is arranged, which can rotate around its own longitudinal axis, which [rod] is provided on its free end with a swivelling lever 40. Each of the swivelling levers 40 can swivel into two final positions. In the open final position, the respective swivelling lever 40 releases the region between the side pieces. In the locking final position, the two swivelling levers 40 have swivelled toward one another and thus block the receiving member.

Figure 14:
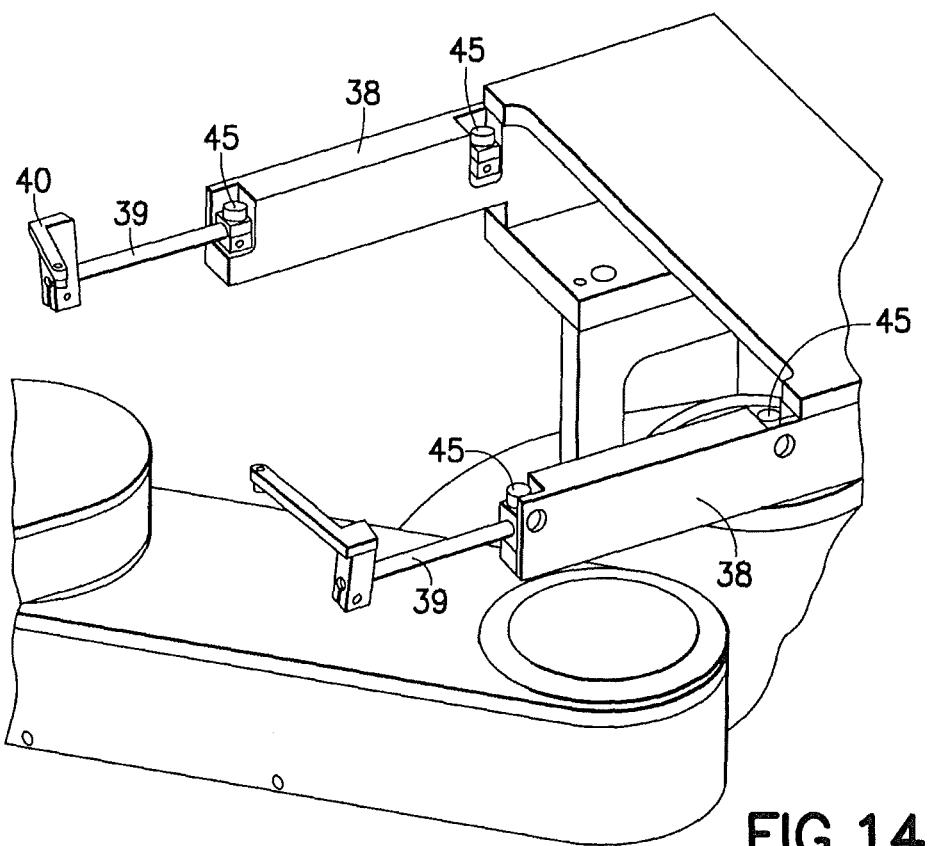
FIG. 14 shows a perspective representation of a locking part of the manipulating device of FIG. 10.
Figure 15:
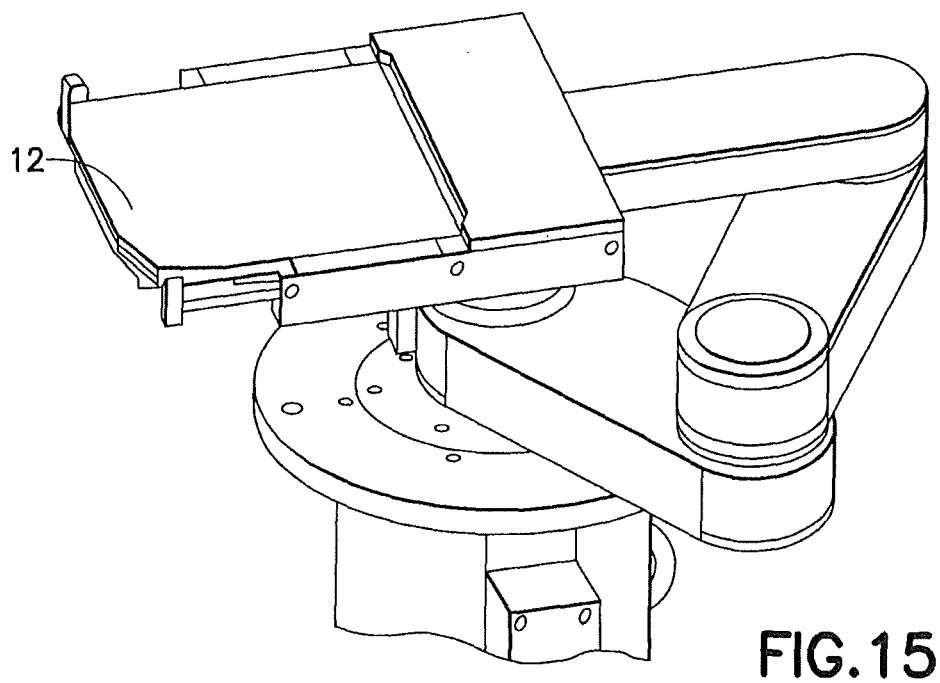
FIG. 15 shows a perspective representation, in which the gripping part is introduced into the locking part.
Figure 16:
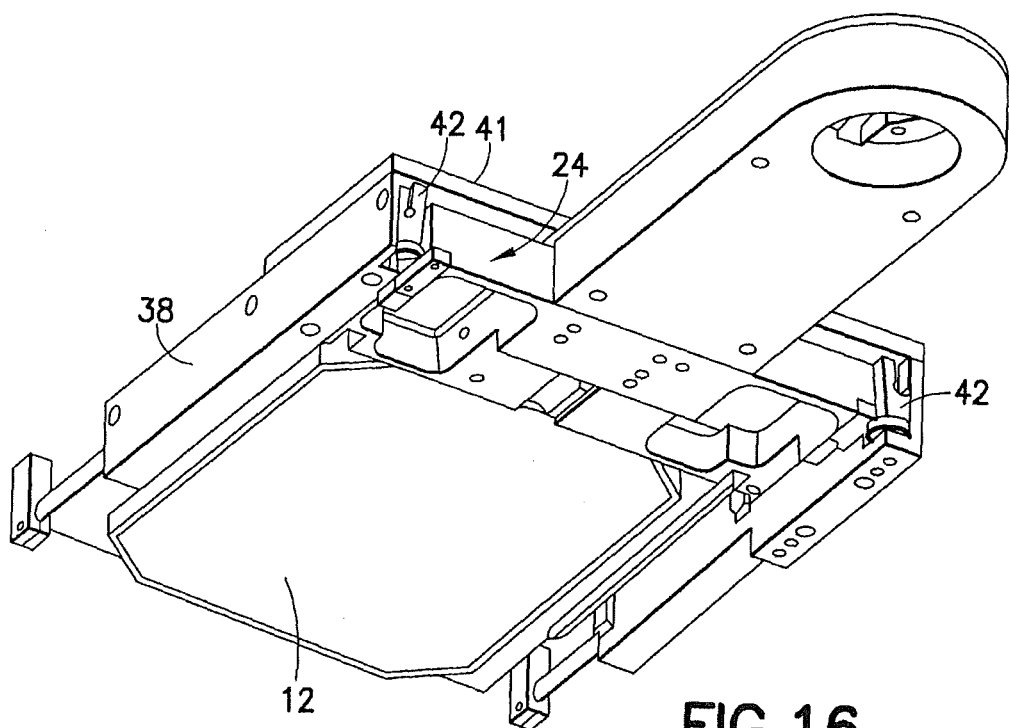
FIG. 16 shows a perspective view of the gripper from below.

A cross brace 41, which limits an insertion length of reticles between the two side pieces 38 is arranged at both side pieces 38. As can be seen best from FIG. 16, a switch 42 is arranged in the region of a back end of cross brace on both side pieces. When switch 42 is actuated by gripping part 24, rods 39 are rotated around their longitudinal axis. In this way, rollers 45 arranged in side pieces 38 (see FIG. 14) are tipped several millimeters in the direction of the side piece which lies opposite and the two swiveling levers 40 are swiveled from their original open final position (FIG. 14) to the locking final position (FIG. 15).

In order to grasp a reticle 12, the two rods 28 can be moved from one front side of the reticle from underneath its glass plate, so that the rods grasp between them the foot 12a of the reticle. This feed movement of the gripper is illustrated in FIG. 11. As soon as the gripping part 24 has contacted the front side of the reticle by the stopping face 28b, the current consumption of the electric motor of the bent-arm robot producing the drive motion increases. This is used in the present example of embodiment as a criterion, which compels the control of the bent-arm robot to stop the feed movement.

Figure 13:
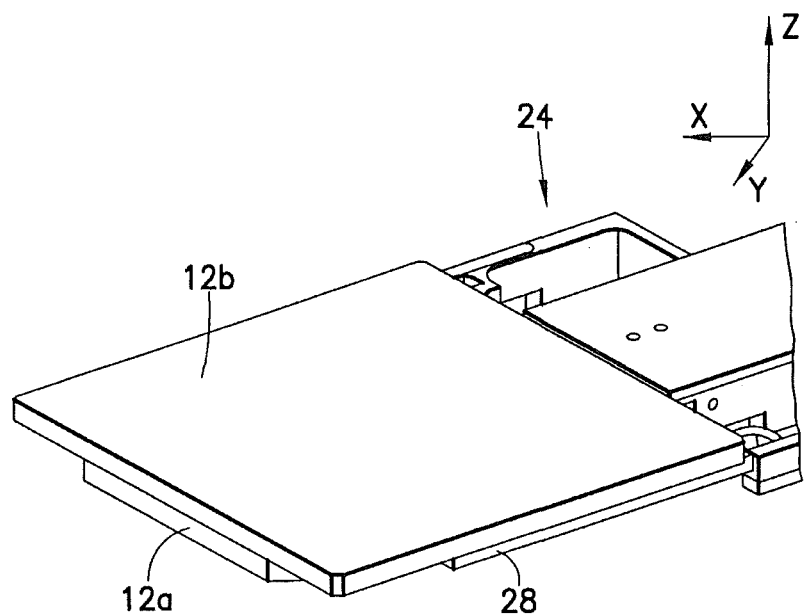
FIG. 13 shows the gripping part of FIG. 11 together with a reticle.

The reticle 12 can then be lifted by means of a subsequent travel movement along the Z-axis. The reticle 12 thus lies with the underside of its glass plate 12b on cams 28a of the two rods 28, as is shown in FIG. 13. Accordingly, the gripping part 24 is inserted into the locking part 23 of the gripper. The reticle 12 is introduced between the two side pieces 38 into the receiving member by an essentially rectilinear travel movement of the gripping part 24. This travel movement can be achieved by coordinated swivel movements of all three swivel links.

As soon as gripping part 24 arrives under the cross brace in this way and makes contact with the two switches, the rods 39 and the swiveling levers 40 are swung into their locking final position. The rollers 45 are pressed outward at essentially the same time, i.e., pressed into the receiving member. The rollers 45 in this way not only clamp the reticle 12 between them at its lateral surfaces, but also center it in this way between the side pieces 38. In this final position, the gripping part 24 is thus found with the two rods in the receiving member 37. The reticle 12 therefore lies on rods 28 and is now ready for transport inside the manipulating device by means of the gripper.

In order set the reticle 12 down again at a specific place, the exact sequence occurs in reverse. The switches 42 are unloaded by a movement of the gripping part 24 in the direction of swivelling levers 40. This causes a release of the clamping of reticle 12 by rollers 45. Since swiveling levers 40 now also release the receiving member, the reticle can be guided out of the locking part 23 by means of a movement of the gripping part 24, which runs parallel to the rods 39.

Figure 17:
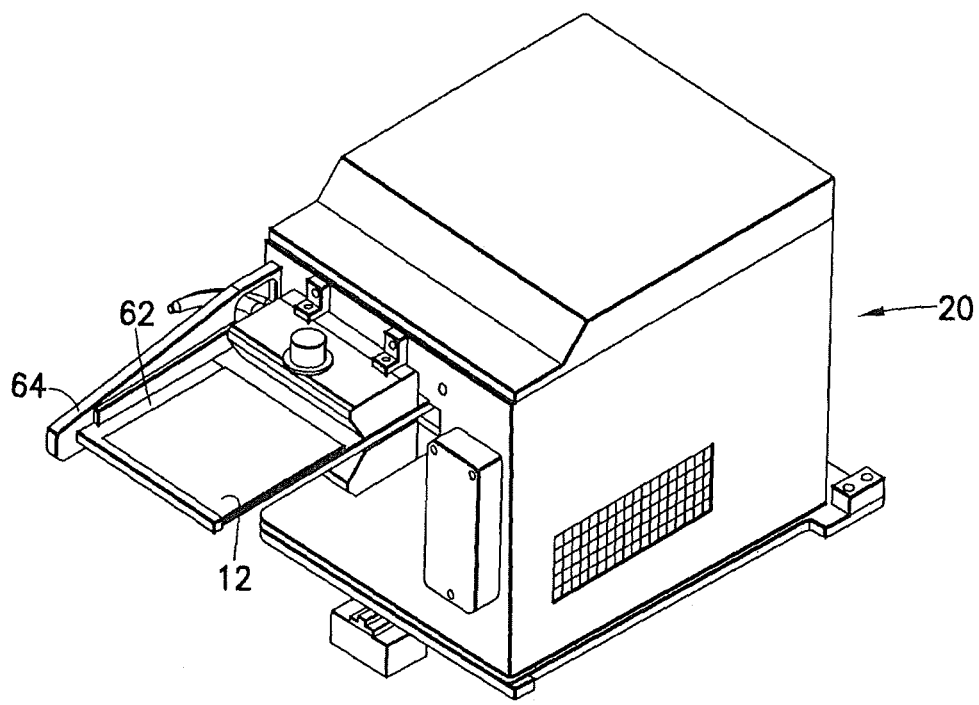
FIG. 17 shows a perspective representation of a detection/cleaning unit of the manipulating device of FIG. 1.
Figure 18:
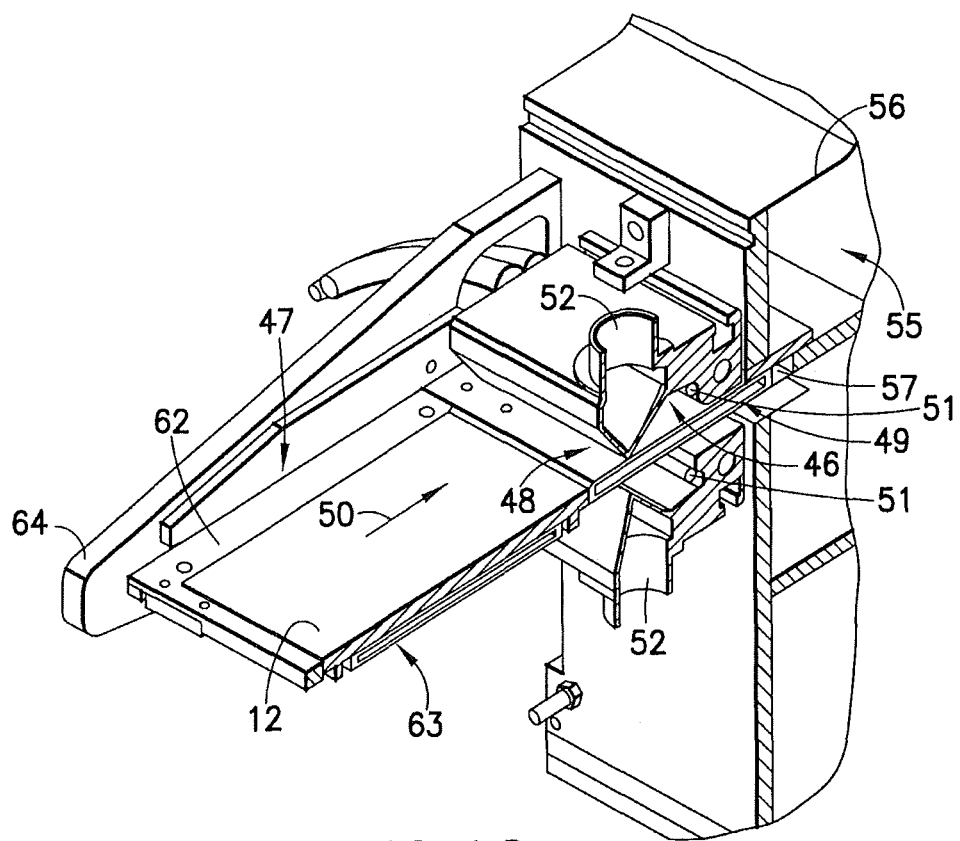
FIG. 18 shows the cleaning part of the functional unit of FIG. 17 in a perspective sectional representation.
Figure 19:
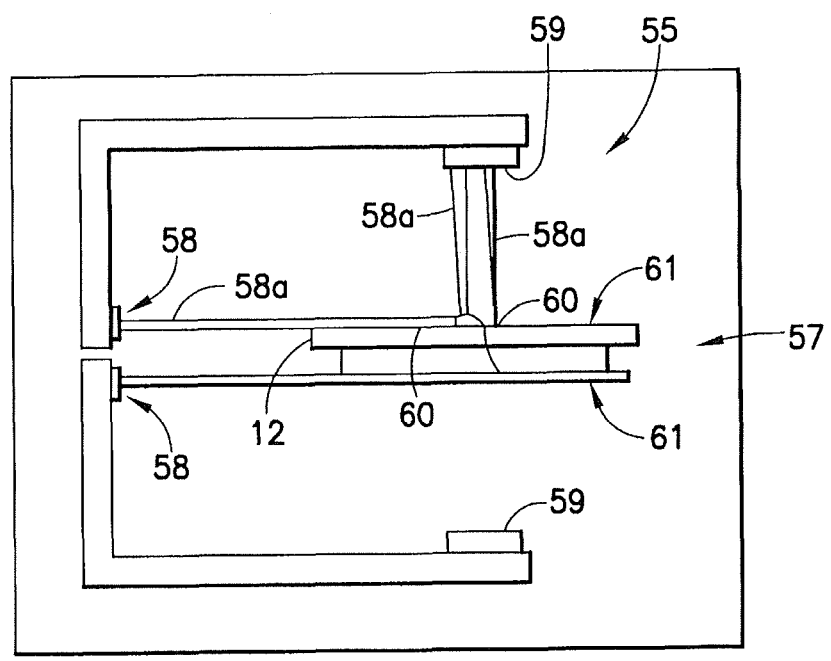
FIG. 19 shows a possible functional principle of the detection part of the functional unit of FIG. 17.

The functional unit [called the] detection/cleaning device 20 of the manipulating device 1 of FIG. 1 according to the invention is shown in detail in FIGS. 17, 18 and 19. This one functional unit is fastened to rack 4 underneath the input/output station 7. The detection/cleaning device 20 also has a cleaning chamber 46, shown in FIG. 18, into which a reticle 12 is introduced through a first opening 48, each time by means of a feeding device 47, conducted through the cleaning chamber 46, and can be taken out again through a second opening 49 at the other end of cleaning chamber 46. Pure air or pure nitrogen can be blown in from one or more nozzles 51 in the form of one or more air flows onto each side of the reticle in cleaning chamber 46 in the region of one back end of cleaning chamber 46 in the feeding direction 50. The pure air guided over reticle 12 entrains dirt particles found on the reticle. The pure air is drawn off again from cleaning chamber 46 via at least one suction channel 52 arranged on each side of the reticle in the vicinity of an insertion slot.

An ionization element, which is not shown in detail, is arranged in the direction of flow between nozzles 51 and the respective suction channel 52. The air flow is ionized by this element in order to break down or prevent electrostatic charges. Otherwise, the structural layout of the part of the device 20 intended for cleaning is essentially identical to the device described in WO 02/01292 A1.

A detection unit 55 is arranged directly behind the cleaning chamber. As can be seen from FIG. 17 and FIG. 18, the cleaning chamber 46 can be fastened to the housing 56 of detection unit 55. The latter has a housing with an insert gap 57. The two openings 48, 49 and the insert gap 57 lie at the same height and are flush with one another. The detection unit 55 used in connection with the example of embodiment is provided with two light sources 58 and two photosensors 59, by means of which the magnitude of a scattering of light 58a directed essentially parallel over the upper side of a reticle can be measured. By measurement of this magnitude, it is possible to draw conclusions on the degree of any remaining contamination or on the size of dirt particles 60, which are found on the bottom and top side 61 of reticle 12. The functional principle of such a detection unit is shown in FIG. 19 and described in detail in WO 02/01292 A1. The disclosure content of WO 02/01292 is incorporated herein by reference, relative to the structural layout and mode of operation of the cleaning chamber and detection device described therein.

According to FIG. 18, a loading position of the feeding device is found directly in front of the first opening of the cleaning chamber. A carriage 62 of the feeding device 47, which can be loaded with a reticle, is essentially U-shaped. A reticle 12 can be inserted into the carriage 62 into an insertion opening 63 of the carriage by means of a horizontal movement of gripping part 24. The carriage 62, fastened to a bearing arm 64, can travel back and forth along the arrow 50 by means of a driven movement. The length of the travel movement extends from the loading position shown in FIG.

18 directly in front of the cleaning chamber up to a detection position inside the detection unit 55. In the latter position, the reticle 12 is entirely arranged in the housing of the detection unit.

By a horizontal travel movement of the carriage in the direction of the insert gap 57, it is possible to introduce reticle 12 into the detection unit 55 after its cleaning in the cleaning chamber by a continuation of the same travel device. For this purpose, it is not even necessary to change the direction of travel movement of the carriage 62. Another manipulating step need not be conducted between introducing the reticle into the cleaning chamber 46 and the detection unit 55. It is thus possible to introduce a reticle into both the cleaning unit and the detection unit with only one travel movement and by only one clamping process.

Figure 20:
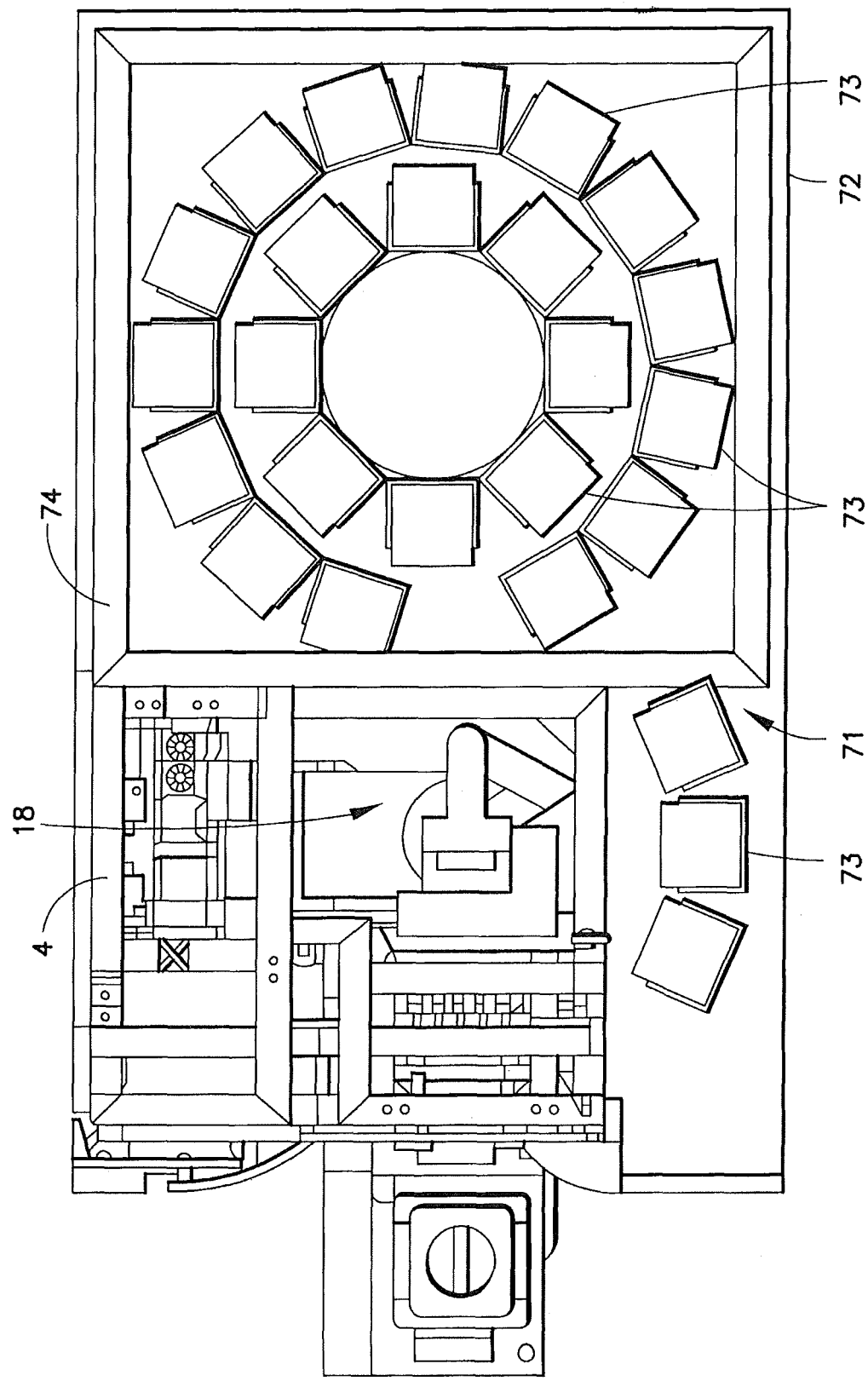
FIG. 20 shows another embodiment of the manipulating device, belonging to the same system.

A second reticle manipulating device 70 is shown in FIG. 20 and this belongs to the same system as the reticle manipulating device 1 of FIG. 1. The example of embodiment of FIG. 20 has, as the basic module, the complete reticle manipulating device 1 of FIG. 1. However, the corresponding part of the wall of housing 2 is removed on two sides and a first example of embodiment of a functional unit [called a] "stocker module" is put in place. The stocker module 71 has a rack extension 74, which is screwed onto predetermined places of rack part 4 of the basic module. Outer sides of the rack extension 74 also bear parts of the housing 72, which is closed in the case of FIG. 20, in order to be able to create and maintain a clean-room atmosphere inside the manipulating device 70.

Shelf units 73 are arranged in the form of two concentric circles inside the rack extension 74. Each of these shelf units 73, which are identical to one another, have several vertically stacked compartments, which are not shown in detail, and in each of which, a reticle can be intermediately stored. Each of the circles can be formed so that it can rotate independently from the other circle. In this way, the individual shelf units can be brought into accessible positions in which the opposite-lying manipulating device 18 can place reticles into each compartment or can remove them therefrom.

The stocker module also has three other shelf units 73 arranged next to one another on another adjoining side of the basic module. These shelf units are also in the accessible region of the manipulating device 18.

Figure 21:
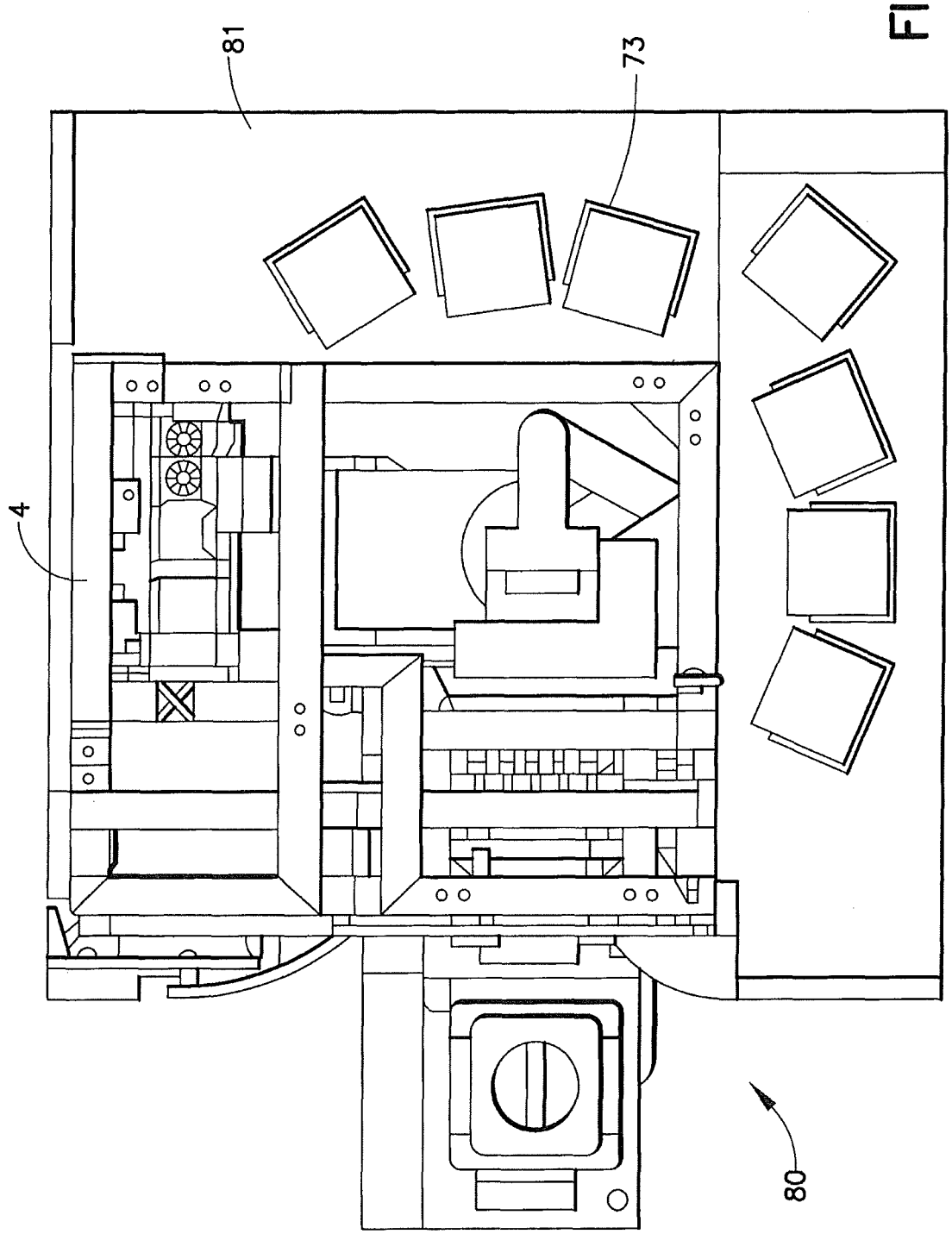
FIG. 21 shows still another embodiment of the manipulating device, belonging to the same system.

FIG. 21 shows another configuration of a manipulating device 80 belonging to the same system. This one is also based on the basic module, as it is rendered in FIG. 1 and FIG. 2. Here also, on the basic module, a rack extension 81 is introduced in a detachable manner on the rack part 4 of the basic module via a mechanical interface in the form of predetermined screw connections. Also, the stocker module is connected to the basic module and particularly to the control of the manipulating device via an electrical interface not shown in detail. In fact, a smaller number of, but principally the same shelf units as in FIG. 20 are used in the stocker module of FIG. 21. Of course, in the example of embodiment of FIG. 21, the shelf units are arranged around one corner of the basic module.

Figure 22:
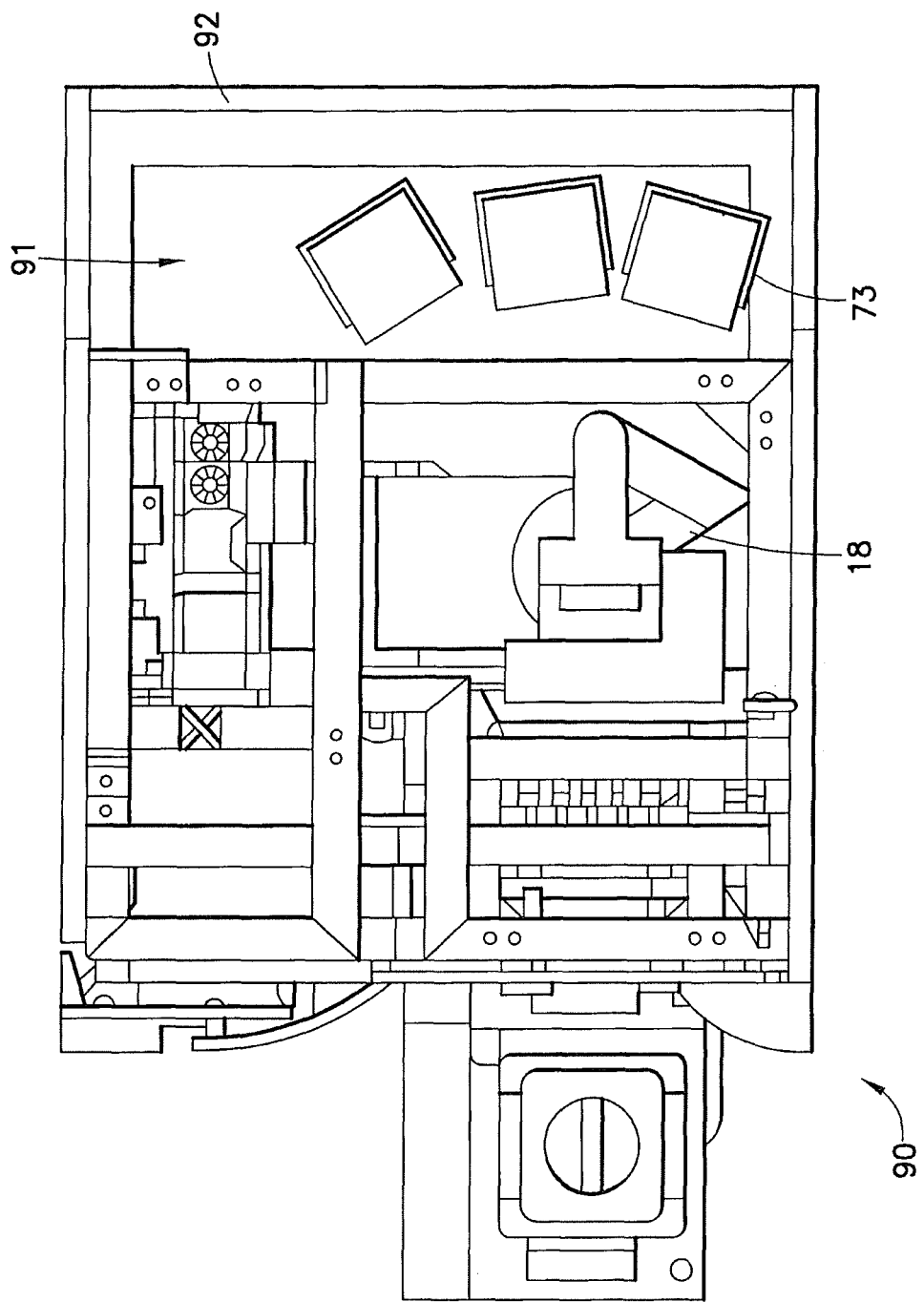
FIG. 22 shows yet another embodiment of the manipulating device, belonging to the same system.

FIG. 22 also shows another example of embodiment of a manipulating device 90 according to the invention. This one is also based on the same basic module and has another variation of a stocker module 91 for expanding the functions of the basic module. In turn, the shelf units 73 already shown in FIG. 20 are arranged in a rack extension 92, which is fastened to the rack part 4 of the same basic module via an interface. In this example of embodiment, the shelf units 73 are mounted along one longitudinal side of the basic module in the region of the manipulating device 18.

Figure 23:
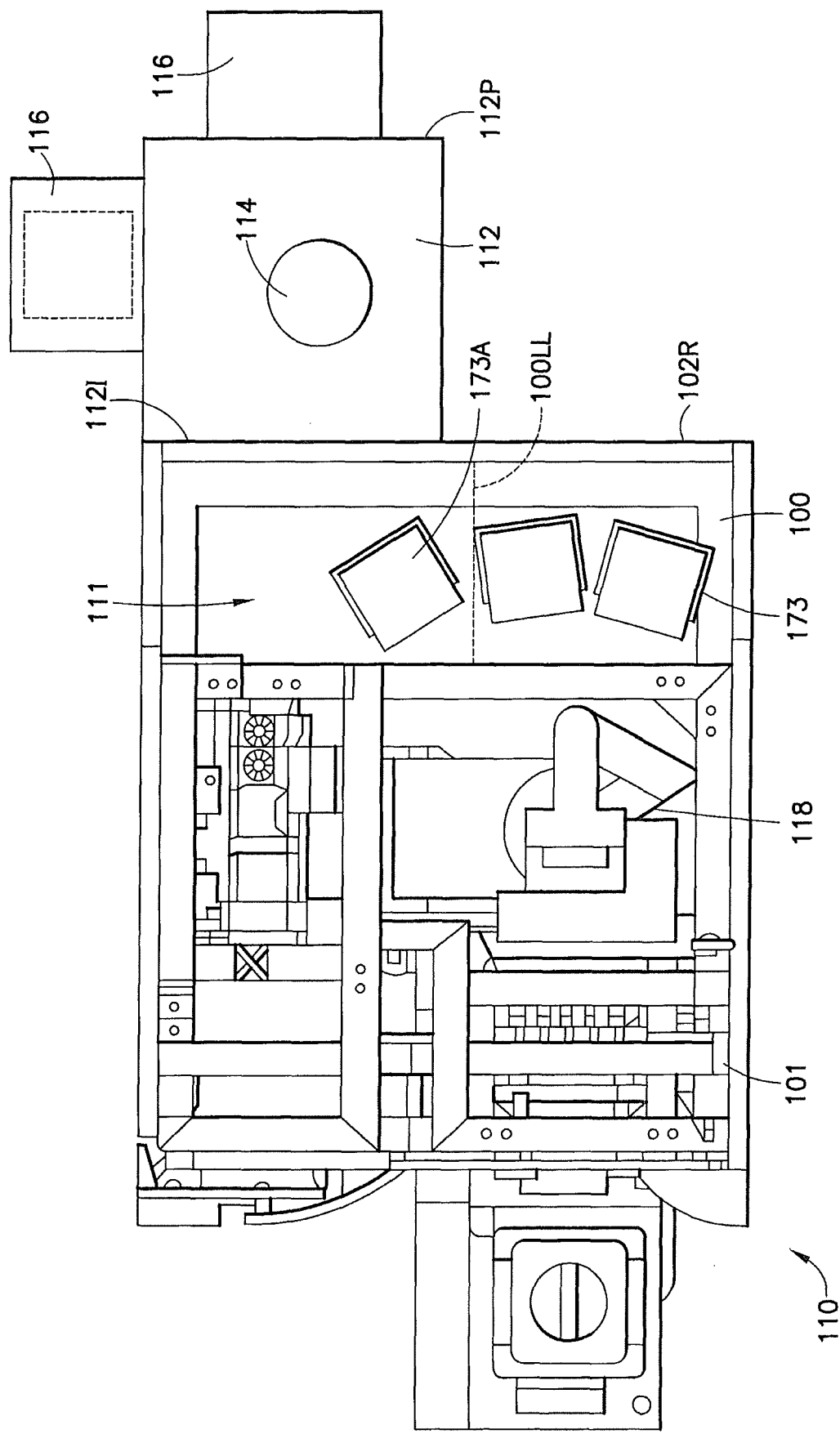
FIG. 23 is a schematic plan view of still yet another embodiment of the reticle manipulating processing system.

Referring now to FIG. 23, there is shown a schematic plan view of a reticle manipulating and processing system 110 in accordance with another embodiment. System 110 is generally similar to other embodiments of the manipulating device 70, 80, 90 described before and shown in FIGS. 20-22. Similar features are similarly numbered. System 110 thus generally includes reticle manipulating device 101 (substantially the same as device 1 shown in FIGS. 1 and 2) and stocker module 100. In this embodiment, system 110 includes a desired reticle process tool 112, such as for example a lithography tool, reticle patterning tool, or a metrology station, a pod stocker, or a single/multiple reticle transfer device. As seen in FIG. 23, in this embodiment the tool or station 112, shown schematically as a quadrilateral, though in alternate embodiments station 112 may have any suitable shape, is mated to the stocker module 100 of the device 110. The station 112 may be mated to the device in any suitable manner. By way of example, desired portions of the walls of housing 102 (of device 101) may be extended to integrally encompass the perimeter 112P of station 112. This is similar to the manner in which the walls of housing 2 are expanded to define the stocker module of the device 70, 80, 90 shown in FIGS. 20-22. Otherwise, the housing 102 may be provided with an interface on wall 102R for mounting or joining modular station 112 to the housing. In that case, station 112 may have a suitable modular frame with attachments for mounting. In any event, an inner partition or wall 112I is defined between the station 112 and stocker module 100 of the device. As can be realized, the inner wall 112I has a suitable opening 112O allowing for reticle transfer between the stocker module 100 and station 112. The opening 112O may be closable with a suitable door or valve (not shown) so that the station 112 may be isolated from the stocker module and vice versa. Accordingly, the station 112 may have a different environment, such as full or partial vacuum, inert gas, filtered air, atmospheric, or any other, that if desired, may be different from the environment in the stocker module 100 or manipulating device 101. If desired, an additional partition or wall 100LL may be located in the stocker module 100 of the device to form an interface or load lock section 111 around a desired shelf portion 173A of the stocker module. The wall may also have a sealable opening for reticle transfer. Further, the load lock section 111 may be provided with suitable systems (e.g. piping, valving, controls) for cycling the load lock environment to conform with either of the environments in the device 101, 100 or the station module 112. In alternate embodiment, an interfacing load lock module may be provided exterior to the housing, between the stocker module and station. As can be realized, the load lock section 111 allows the different environments in the station 112 and device 101, 100 to be maintained while transferring reticles therebetween. In the embodiment shown in FIG. 23, the stocker module 100 has a shelf position 173A, (shown here within the load lock section 111) that can be reached by positioning mechanism 118 to pick or release reticles in the stocker module 100. Reticles may be moved from position 173A to and from the station 112. In this embodiment, one shelf position 173A is shown for example purposes, though the device may have any desired number of shelf positions that can be reached by the positioning mechanism 118, and from/to which reticles may be transferred from the station 112. The shelf positions may be stacked vertically as well as distributed horizontally as shown. It is noted, that though one station 112 is shown in FIG. 23, in alternate embodiments the system may have any desired number of stations/processing tools. As seen in FIG. 23, the station may include an integral reticle transfer device 114 for transporting reticles between shelf position 173A and the station 112. The transfer device 114 may be similar to positioning device 18 described before and shown in FIGS. 10-16, though any other suitable transfer device may be used. As seen in FIG. 23, a number of processing modules 116 may be mounted to one or more sides 112P of the station 112, such as for example, when station 112 is a lithography tool and the modules are processing modules for effecting the lithography process. Otherwise, each module, 116 may be a metrology station, or a reticle patterning module, or a load lock module. In the event a load lock module 116, is provided, it may connect the station 112 to an environmental front end module (EFEM) (not shown), a transport system for transporting reticles or another processing tool (not shown).

Figure 24:
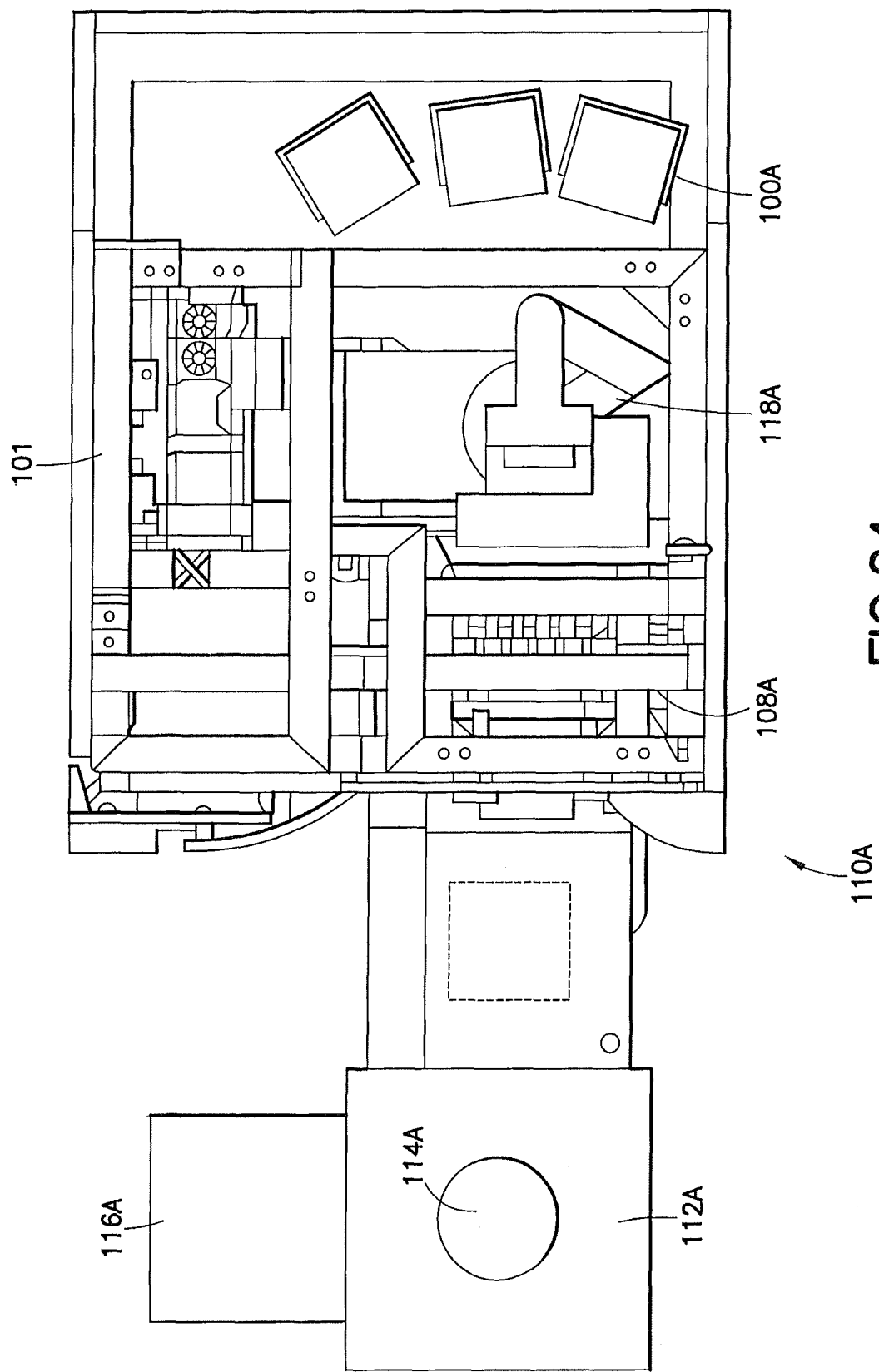
FIG. 24 is a schematic plan view of still another embodiment of the reticle manipulating processing system.

Referring now to FIG. 24, there is shown a schematic plan view of yet another embodiment of the reticle processing system 110A. System 110A in FIG. 24 is generally similar to system 110 in FIG. 23, and similar features are similarly numbered. System 110A includes device 101A with stocker module 100A, though in alternate embodiments the device may not have a stocker module. System 110A also includes one or more processing tools or stations 112A (only one station 112A is shown in FIG. 24 for example purposes). In this embodiment, the station 112A is mated to device 101A by an interface module 108A. Module 108A may be mounted in the housing 102A. Otherwise, the module interfacing the station to the manipulating device may be mounted outside the housing and may have an interface extension extending into the housing. As shown in FIG. 24, in this embodiment, the module 108A may be sized to have a similar exterior envelope as input/output unit 8,8' (see FIGS. 1, 5 and 6A) and may be mounted into a desired compartment of the mounting frame. In this case, the interface module 108A may be capable of holding one or a few reticles. In embodiments where a larger number are to be handled in the interface module, the module 108A may be sized to be mounted into input/output drawers of the manipulating device 101A similar to drawers 16, 17 shown in FIG. 1. As noted before, the interface module 108A is modular, with an exterior casing similar to the casing of units 8,8'. Accordingly, the interface module 108A may be mounted in any of the compartments of the frame of the device 101A (similar to frame 22 of device 1). Module 108A, hence, may include suitable mechanical mounts for attaching the module to the device frame, as well as connectorized connections for electrical and fluid systems similar to the connections of unit 8' shown in FIG. 6a. The station 112A, similar to station 112 in FIG. 23, may be any desired processing tool such as a lithography tool, a reticle patterning tool, a metrology station, a tool stocker, or a single/multiple reticle transfer device station. In the case of a lithography tool, for example, station 112A may include a transfer chamber 112A with a reticle transfer mechanism 114A, and a number of processing chamber modules 116A connected to the sides of the transfer chamber. In the case where the station 112A may have a different environment than the device 101A, the interface module 108A may be configured as a load lock. Accordingly, the module 108A may have inner and outer doors (not shown) for respectively closing reticle transfer openings between module and station 112A, and between module 108A and the interior of device 101A. Reticle manipulating device 118A of device 101A may be used to move reticles into/out of module 108A. The reticles may be moved between the module 108A, and hence device 101A, and the station 112A by transport device 114A. Similar to system 110 in FIG. 23, reticles may be transported, via a closed transport box similar to transport boxes 10, 10a in FIGS. 3 and 7, into device 101A, and then may be transferred within the controlled environment of device 101A and station 112A without using further transport boxes 10. The transport box 10 may be placed into an input/output unit similar to unit 8 and the box opened to allow access to the reticle. The reticles may be picked with the manipulating device 118A, and transferred from the input/output unit to the interface module 108A. In the event the module 108A is a load lock, the load lock is cycled to have the same environment as in section 112A. The load lock may then be accessed by the transfer device 114A in section 112A to transfer the reticle to section 112A and to one or more of the processing chamber modules 116A connected to section 112A. After processing, the reticle may be returned to the transport box in a similar but reverse manner. In alternate embodiments, the modules connected to station 112A may be load lock modules, connecting station 112A to other processing tools or EFEMs. In still other alternate embodiments, station 112A itself may be a load lock such as may be used for connecting device 101A to a reticle transport system. Station 112A may be a modular unit that may be connected as in the embodiment shown in FIG. 24, to the front face of the device 101A. In alternate embodiments, the station 112A may be located on any side of the device, the interface opening of the interface module being positioned on the desired side to communicate with the station 112A. In other embodiments, the processing station may not be connected to the device, and the load lock module in the device may be used to provide the device with different environmental zones or isolate the device from an exterior environment.

Figure 25:
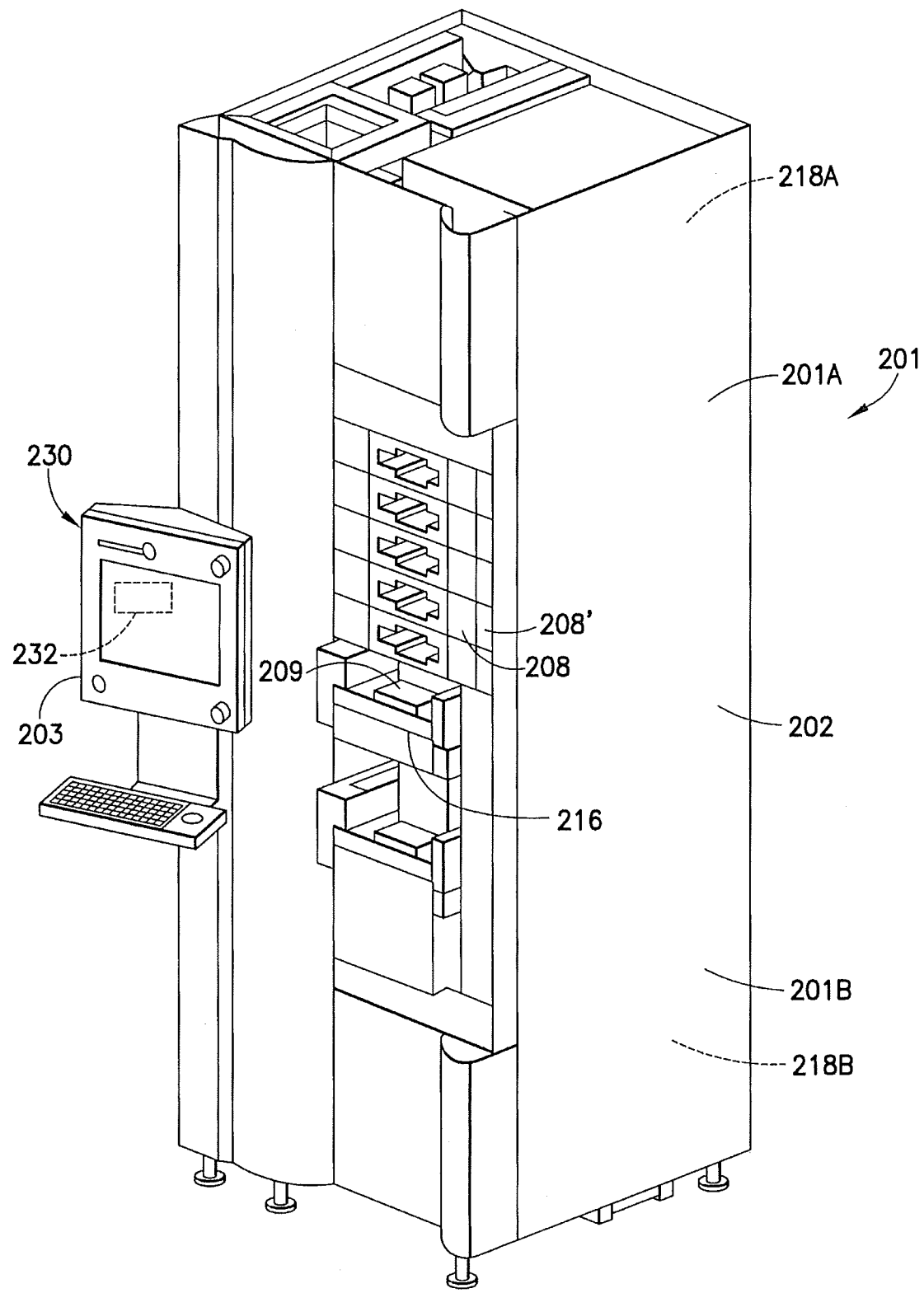
FIG. 25 is a schematic perspective view of still another embodiment of the reticle manipulating system.

Referring now to FIG. 25, there is shown yet another embodiment of the device 201. Except as otherwise noted, device 201 is generally similar to device 1 described before and shown in FIG. 1. Similar to device 101A in FIG. 24, device 201 also includes a load lock module 208. Load lock module 208 is generally similar to module 108A described before. Load lock module 208 allows the environment inside the housing 202 of the device to be isolated from, and hence different than the environment outside the housing. The device 201 may be maintained for example in an inert gas environment or a sealed pressurized environment. In alternate embodiments, the device may have any suitable environment, including a vacuum, or partial vacuum environment. In this embodiment, a transport box, similar to box 10 in FIG. 3, or SMIF pod 10a in FIG. 7, as the load lock module 208 may be configured to accept any style transport box, may be placed through the sealable outer opening into the load lock module 208. The load lock module 208 may then be closed and cycled to have an environment matching the environment in device 201. The reticle, similar to reticle 12, may be removed from the transport box at any time. In alternate embodiments, the load lock module may include a chamber (not shown) for receiving and interfacing with the transport box, and another chamber isolatable from the transport box interface chamber. In this event, the reticle may be removed from the box in the interface chamber, and may be moved, for example by a suitable transport mechanism (not shown) in the interface chamber into the isolatable chamber of the load lock module. In this manner, potential contaminants on the transport box would not be carried into the load lock chamber of the module.

The device in FIG. 25 may include multiple environment zones 201A, 201B. In this embodiment, only two zones are shown, but the device may have any number of environment zones. The zones 201A, 201B are isolated from each other and may contain different environments. The modules connected to the respective zones may also have different environments, corresponding to the zone 201A, 201B with which they are in communication with. Each zone 201A, 201B may include a dedicated reticle transfer arm 218A, 218B, similar to arm 18, for transferring reticles within a corresponding environment zone 201, 201B of the device. The device may include additional load lock modules 208, 208' allowing reticle transfer between each zone while allowing the environment to be maintained in each zone. Load lock 208' may be configured, to transfer reticles between the different environment zones of the device. For example, the load lock module 208' may have a sealable aperture (not shown) facing load lock 208. This aperture, when open, allows the load lock module 208' to communicate with load lock module 208. The load lock module 208' may be provided with an indexing platform to move a reticle between load lock modules 208', 208. The indexing platform may also be used to seal the aperture between the load locks when the platform is cycled to one position (i.e. "UP") or another position (i.e. "DOWN"). In alternate embodiments, each module of the device may be maintained in a different controlled environment.

The device 201 in the embodiment shown in FIG. 25, may include, similar to device 1 in FIGS. 1-2, any suitable types of modules having any suitable functions. Each module has a shape to be mounted in one or more of the compartments or drawers of the mounting frame of the device. For example, the device 201 may include one or more processing modules 209. For example, modules 209 may include a module for cleaning reticles using gas, $CO_2$, or wet based methods. Such reticle processing modules may be located in a corresponding environment zone or may interface with a load lock module, to isolate the environment in the processing module from the rest of the device. In alternate embodiments, the module for cleaning may use an electromagnetic radiation based system, such as UV light, for cleaning reticles. The processing modules 209 may further include modules such as an ESD module to detect an electrical charge on a reticle. Another example of a suitable processing module 209 may have a CCD camera 216 for magnified visual inspection of the reticle. Camera 216 may have any desired resolution to detect scratches, damage to a pellicle mounted to the reticle, or large particulate matter on the reticle. Other examples of processing modules that may be installed in device 201 include, a module for measuring airborne molecular contamination, a module for reading identifying indicia (e.g. bar codes, alpha numeric codes) on the reticle or a pellicle (not shown) mounted to the reticle. Yet other examples would be, modules for detecting flatness of reticle and pellicle (if mounted to the reticle), modules capable of "offline" reticle verification while the device is idle or in a standby mode, and modules to test a reticle to verify the integrity of the system (i.e. "golden reticle").

As seen in FIG. 25, the processing modules 209 may be communicably connected to the processor 203 (at the input station) to provide device 201 with a predictive maintenance system 230. For example, processor 203 may include suitable software 232 for tracking usage of a reticle. For instance, processor 203 may receive data from the processing module 209 capable of reading identifying indicia on the reticle to indicate when a given reticle is used. The processor records the reticle use and tracks, with software 232, the number of times the given reticles has been used. The software 232 has means, such as a predictive algorithm or table, to indicate the number of uses when a given reticle is no longer to be used or is to be serviced or cleaned prior to next use. The software 232 may be arranged to use other reticle condition data received by processor 203 from other processing modules 209, to determine when a given reticle is no longer suitable for use or should be services. Device 201, similar to device 1 in FIGS. 1-2, as well as systems 70, 80, 90, 110, 110A may operate with any desired type of reticle such as extreme UV bare reticles, 157 mm reticles, X-ray reticles and Scattering with Angular Limitation Projection Electron-Beam Lithography (SCALPEL) reticles, or any other suitable reticles.

As can be realized from FIG. 25, the device 201 may be selectably configured as desired with any of the interchangeable modules 209, 216. In addition to the previously identified examples of different processing modules 209 that may be installed in device 201, there are still other examples. For instance, interchangeable modules 209 may include buffering modules for temperature and humidity control (e.g. having heating/cooling elements or humidity/pressure control systems). These modules may be used to condition a reticle, prior to moving the reticle to a process tool (such as for example a tool at station 112, 112A in FIGS. 23-24), or stocker, in order to minimize thermal or other environmental differences to which the reticle may be subjected when transferred between device 201 and the process tool or stocker. This kind of buffering module may also be used when transferring reticles to different processing modules having different environmental conditions within the device 201. Still other examples of suitable buffering modules include modules capable of N2 purge or other gas purges. Still other processing modules 209 that may be installed in device 201 include a module for gathering particles on a reticle such as by thermoferisis. This module may include one or more charged plates on opposite sides of a reticle inducing a bias on any particles on the reticle so that the particles are moved to one side of the reticle. Another example of a suitable module may include a laser communicably connected to processor 203 when the module is installed in the device for scribing readable information on the sides or top of the reticle. Yet other suitable examples of modules include a module with an accelerometer to detect movement of the device 201. The accelerometer data may be communicated to processor 203 which, upon receiving data indicating motion above a certain threshold, causes the device to enter a "safe mode". In this mode, reticles in the stocker (see FIGS. 20-25) are safed, individual reticles in modules are clamped as are reticles in pods. When data from the accelerometer indicates to processor 203 that motion is below the threshold, processor 203 allows an operator, or on its own, may return the device to the operating mode. Still another example of a suitable module 209 is one capable of aligning, mounting and demounting a pellicle (not shown) to a given reticle.

Figure 26:
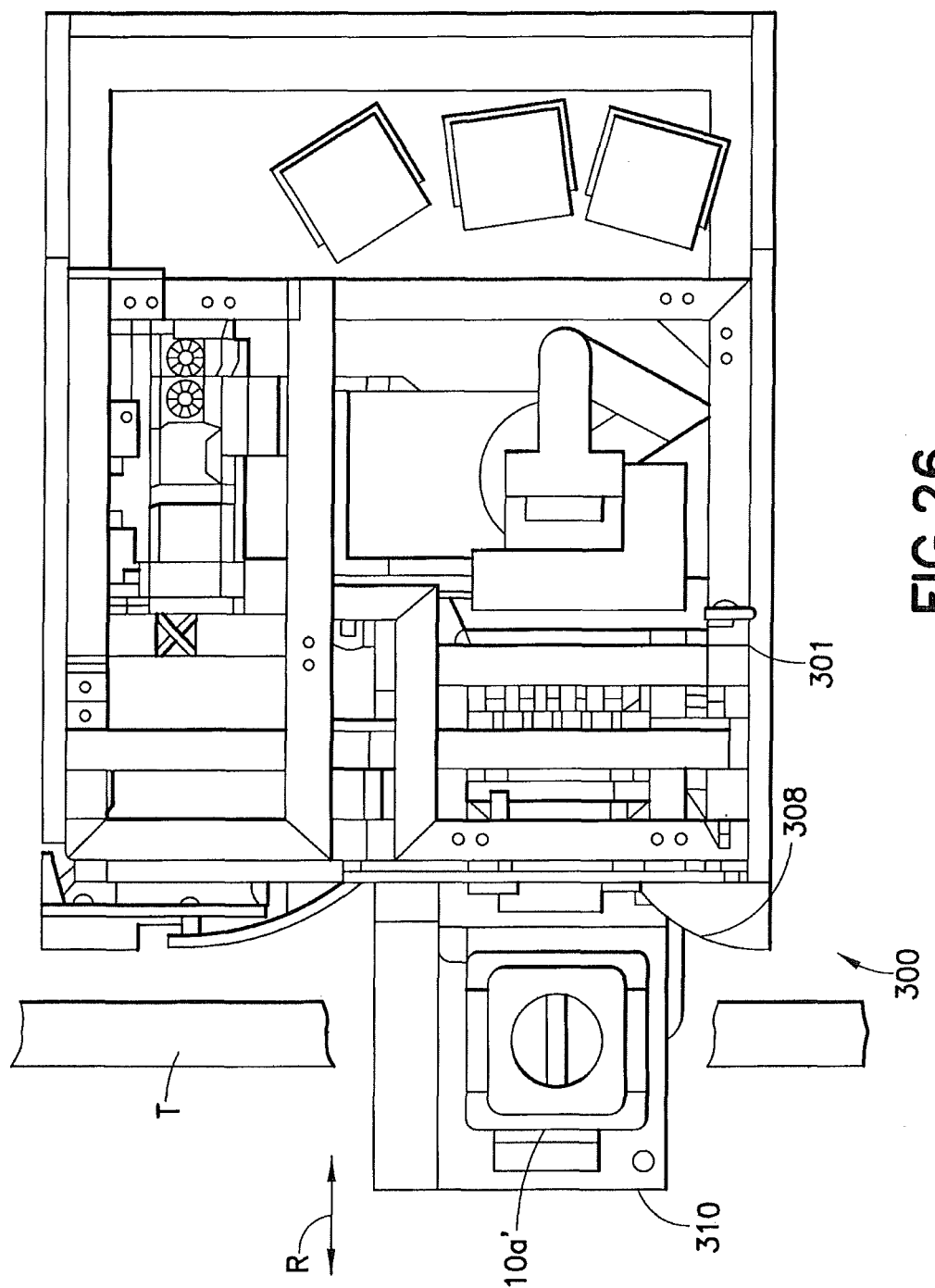
FIG. 26 is schematic plan view of still yet another embodiment of the reticle manipulating system.

Referring now to FIG. 26 there is shown a schematic plan view of a reticle manipulating system 300 and a portion of a track T of an automated material handling system (AMHS). Track T may be any suitable type of track of an AMHS that allows transport vehicles (not shown) capable of carrying reticle transport boxes, (similar to boxes 10, 10a see FIGS. 3 and 7) to move along the track. In this embodiment, the track may be mounted over device 300, though in alternate embodiments, the track may be located in any suitable location. One example of a suitable AMHS system is the Aeroloader™ system from Brooks Automation, Inc. The vehicle on the track T may be an active vehicle capable of transferring the box from the vehicle to the device 300. Device 300 is substantially similar to device 70, 80, 90 in FIGS. 20-22. Device 300 has a manipulating device 301 with an interface module 308 installed in the device in a manner similar to that described before for other modules of the device. Module 308 may have a platform extension 310 located as shown in FIG. 26 so that track T crosses over the extension 310. The extension is sized to allow a vehicle (not shown) on track T to place reticle transport box 10a' on the extension. The extension may be powered by any suitable drive to move the transport box 10a' (in the direction indicated by arrow R) into or out of the module 308 of device 301 so that the reticle may be removed/placed in the box. The vehicle may also pick the transport box from the extension.

Referring now to FIG. 27, there is shown a schematic plan view of still yet another embodiment of the device 400 and an integrated processing system 500. Device 400 is substantially similar to device 110, 110A described before and shown in FIGS. 23-24. Device 400 includes device 401. Device 401 has an input/output module 408 connected to the system 500 as shown in FIG. 27. System 500 is an integrated processing system, such as shown and described in U.S. patent application titled "Substrate Processing Apparatus", filed Jul. 22, 2003, Ser. No. 10/624,987, incorporated by reference herein in its entirety. System 500 has a linear transport chamber forming a transport path for a vehicle (not shown) capable of carrying one or more transport boxes similar to boxes 10, 10a in FIGS. 3 and 7. The transport chamber 506 communicates through valve 504 with a load lock chamber 502. In alternate embodiments, the load lock may be included in module 408 of the device in which case the transport chamber would be mated directly to the module. The vehicle in the transport system 500, may be active and capable of transferring the box from the vehicle to the module 408.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A reticle manipulating device comprising:
   a housing capable of having a controlled environment therein and having at least one processing module interface;
   at least one processing module connected to the housing, the at least one processing module having a closable opening through which a reticle is inserted into the at least one processing module for processing the reticle; and
   a transport apparatus connected to the housing for transporting the reticle between the at least one processing module to another portion of the housing;
   wherein the at least one processing module is removably connectable to the housing so as to be inserted at least partly within the housing, the at least one processing module having an interface adapted for removably coupling the at least one processing module to the at least one process module interface of the housing at a predetermined location of the housing, and the at least one processing module being selectable for connection to the housing from a number of different interchangeable modules each having a different predetermined characteristic defining different corresponding functions of each processing module for processing the reticle and each processing module being capable of interchangeable connection via the interface to each one of the at least one processing module interface of the housing at the predetermined location independent of the different predetermined characteristic.

2. The device according to claim 1, wherein the at least one processing module is adapted for cleaning the reticle using at least one of a gas based, a wet based, or electromagnetic radiation based cleaning method.

3. The device according to claim 1, wherein the housing is capable of holding an inert gas or pressurized gas atmosphere therein.

4. The device according to claim 1, wherein the at least one processing module has a detector adapted for detecting at least one of an electric charge on the reticle, or airborne molecular contamination.

5. The device according to claim 1, wherein the at least one processing module has a camera for magnified visual inspection of the reticle.

6. The device according to claim 1, wherein the at least one processing module has a reader for reading indicia on a pellicle located in the at least one processing module.

7. The device according to claim 1, wherein the at least one processing module has a detector for detecting flatness of the reticle or of a pellicle located in the at least one processing module.

8. The device according to claim 1, wherein the at least one processing module is adapted to store the reticle therein, and the reticle is at least one of an extreme ultra violet bare reticle, a 157 mm reticle, an x-ray reticle, or a SCALPEL reticle.

9. The device according to claim 1, wherein the at least one processing module has a processor with programming for performing predictive maintenance, tracking the number of times the reticle has been exposed to light, and characterized in that the programming includes historical models for predicting reticle servicing, cleaning or disposal.

10. The device according to claim 1, wherein the at least one processing module has a control for controlling at least one of a temperature or humidity within the at least one module.

11. The device according to claim 1, wherein the at least one processing module is adapted for preconditioning the reticle prior to transfer of the reticle from the at least one processing module to the other portion of the housing.

12. The device according to claim 1, wherein the at least one processing module is adapted for gathering particles from the reticle.

13. The device according to claim 1, wherein the at least one processing module is adapted for buffering one or more reticles.

14. The device according to claim 1, wherein the at least one processing module has a scribing device for scribing indicia on the reticle.

15. The device according to claim 1, wherein the at least one processing module is adapted for mounting and demounting a pellicle.

16. The device according to claim 1, wherein the number of different interchangeable processing modules each having a different predetermined characteristic have a height based on a predetermined grid size so that processing modules having different heights are capable of interchangeable connection via a respective interface to each one of the at least one processing module interface of the housing at the predetermined location independent of the different predetermined characteristic.

* * * * *

UNITED STATES PATENT AND TRADEMARK OFFICE
CERTIFICATE OF CORRECTION

PATENT NO. : 8,425,172 B2  
APPLICATION NO. : 12/761499  
DATED : April 23, 2013  
INVENTOR(S) : Blattner et al.

Page 1 of 1

It is certified that error appears in the above-identified patent and that said Letters Patent is hereby corrected as shown below:

On the Title Page, Item (54) and in the Specification, Column 1, Line 1, Title, delete "MANIPULATION" and insert -- MANIPULATING --, therefor.

Signed and Sealed this  
Twelfth Day of May, 2015

Michelle K. Lee  
*Director of the United States Patent and Trademark Office*